US00RE49484E

(19) United States
(12) Reissued Patent
Cho et al.

(10) Patent Number: US RE49,484 E
(45) Date of Reissued Patent: Apr. 4, 2023

(54) ORGANIC LIGHT-EMITTING DISPLAY APPARATUS AND METHOD OF REPAIRING THE SAME

(71) Applicant: Samsung Display Co., Ltd., Yongin-si (KR)

(72) Inventors: Young-Jin Cho, Yongin-si (KR); Young-In Hwang, Yongin-si (KR); Dong-Gyu Kim, Yongin-si (KR)

(73) Assignee: Samsung Display Co., Ltd., Yongin-si (KR)

(21) Appl. No.: 16/807,126

(22) Filed: Mar. 2, 2020

Related U.S. Patent Documents

Reissue of:
(64) Patent No.: 9,911,799
Issued: Mar. 6, 2018
Appl. No.: 14/231,618
Filed: Mar. 31, 2014

(30) Foreign Application Priority Data

May 22, 2013 (KR) ..... 10-2013-0057959
Jun. 14, 2013 (KR) ..... 10-2013-0068638

(51) Int. Cl.
*H01L 27/32* (2006.01)
*G09G 3/3225* (2016.01)
*H01L 27/12* (2006.01)
*H01L 51/52* (2006.01)
*H01L 51/56* (2006.01)

(52) U.S. Cl.
CPC ..... *H01L 27/326* (2013.01); *G09G 3/3225* (2013.01); *H01L 27/1225* (2013.01); *H01L 27/3276* (2013.01); *H01L 51/5203* (2013.01); *H01L 51/56* (2013.01); *G09G 2300/0426* (2013.01); *G09G 2300/0465* (2013.01); *G09G 2300/0819* (2013.01); *G09G 2300/0852* (2013.01); *G09G 2300/0861* (2013.01); *G09G 2310/0245* (2013.01); *G09G 2310/0251* (2013.01); *G09G 2320/043* (2013.01); *G09G 2320/045* (2013.01); *G09G 2330/08* (2013.01); *G09G 2330/10* (2013.01); *H01L 2251/568* (2013.01)

(58) Field of Classification Search
CPC ..... H01L 27/1225; H01L 51/5203; H01L 27/3276; H01L 51/56; H01L 27/326; H01L 2251/568; H01L 27/3223; G09G 3/3225; G09G 2300/0861; G09G 2300/0465; G09G 2300/0426; G09G 2330/10; G09G 2300/0852; G09G 2320/043; G09G 2300/0819; G09G 2310/0251; G09G 2320/045; G09G 2310/0245; G09G 2330/08
See application file for complete search history.

(56) References Cited

U.S. PATENT DOCUMENTS 6,639,634 B1 10/2003 Zhang et al.
6,788,356 B2 9/2004 Song
6,979,956 B2 12/2005 Park et al.
7,248,324 B2 7/2007 Ono et al.
7,645,631 B2 1/2010 Matsunaga
7,777,700 B2 8/2010 Kwak et al.
7,884,785 B2 2/2011 Yamashita et al.
7,978,165 B2 7/2011 Kamada
8,258,692 B2 9/2012 Hong et al.
8,436,956 B2 * 5/2013 Kim ..... G02F 1/133371 349/43
8,922,461 B2 12/2014 Sagawa et al.
9,129,544 B2 9/2015 Saitoh et al.
9,256,109 B2 2/2016 Kang et al.
9,911,385 B2 3/2018 Lee
2001/0028429 A1 10/2001 Wu
2005/0173707 A1 8/2005 Shiraki et al.
2005/0275352 A1 12/2005 Sun
2006/0017674 A1 1/2006 Kamada
2006/0061524 A1 3/2006 Suh et al.
2007/0046186 A1 3/2007 Kim
2007/0075944 A1 4/2007 Shibusawa
2007/0120476 A1 5/2007 Park et al.
2007/0152567 A1 7/2007 Yao et al.
2008/0018636 A1 1/2008 Chang
2008/0024693 A1 1/2008 Lee et al.
2008/0062096 A1 * 3/2008 Yamashita ..... G09G 3/3233 345/82
2009/0108763 A1 4/2009 Han et al.
2009/0262049 A1 10/2009 Yoon et al.
2010/0001941 A1 1/2010 Shin et al.
2010/0026729 A1 * 2/2010 Toyomura ..... G09G 3/3233 345/690
2010/0200869 A1 8/2010 Sekiya
2010/0207106 A1 8/2010 Lhee et al.
2010/0238149 A1 9/2010 Kishi et al.
(Continued)

FOREIGN PATENT DOCUMENTS

CN 1744181 A 3/2006
CN 101110204 A 1/2008
(Continued)

OTHER PUBLICATIONS

KIPO Notice of Allowance dated Sep. 29, 2015, for Korean priority Patent application 10 2013-0068638, (6 pages).
(Continued)

*Primary Examiner* — Ling X Xu
(74) *Attorney, Agent, or Firm* — Lewis Roca Rothgerber Christie LLP

(57) ABSTRACT

Provided is an organic light-emitting display apparatus and a method of repairing the same. The organic light-emitting display apparatus includes: an emission device comprising a plurality of sub-emission devices; an emission pixel circuit configured to supply a driving current to the emission device; a dummy pixel circuit configured to supply the driving current to the emission device; and a repair line coupling the emission device to the dummy pixel circuit, wherein the emission device is configured to receive the driving current from the emission pixel circuit or the dummy pixel circuit.

54 Claims, 33 Drawing Sheets

(56) References Cited

U.S. PATENT DOCUMENTS

| | | | | |
|---|---|---|---|---|
| 2011/0025659 | A1 | 2/2011 | Kwak et al. | |
| 2011/0069061 | A1* | 3/2011 | Nakamura | G09G 3/3225 345/214 |
| 2011/0014066 | A1 | 6/2011 | Kim et al. | |
| 2011/0146066 | A1 | 6/2011 | Kim et al. | |
| 2011/0175885 | A1 | 7/2011 | Shirouzu | |
| 2012/0113077 | A1 | 5/2012 | Kang | |
| 2012/0146034 | A1 | 6/2012 | Hong et al. | |
| 2012/0146999 | A1 | 6/2012 | Hwang | |
| 2012/0306840 | A1 | 12/2012 | Han | |
| 2012/0326603 | A1 | 12/2012 | Kim | |
| 2013/0120230 | A1 | 5/2013 | Chen et al. | |
| 2013/0176194 | A1 | 7/2013 | Jin et al. | |
| 2013/0293236 | A1 | 11/2013 | Lee et al. | |
| 2015/0109189 | A1* | 4/2015 | Hwang | G09G 3/3225 345/78 |

FOREIGN PATENT DOCUMENTS

| | | | |
|---|---|---|---|
| CN | 101202014 | A | 6/2008 |
| CN | 101520560 | A | 9/2009 |
| CN | 101802900 | A | 8/2010 |
| CN | 101989403 | A | 3/2011 |
| CN | 102437112 | A | 5/2012 |
| CN | 102508384 | A | 6/2012 |
| CN | 102983283 | A | 3/2013 |
| CN | 104103234 | A | 10/2014 |
| EP | 2 535 888 | A1 | 12/2012 |
| JP | H 10-123563 | A | 5/1998 |
| JP | 2001-305500 | A | 10/2001 |
| JP | 2001-337349 | A | 12/2001 |
| JP | 2003-050400 | | 2/2003 |
| JP | 2004-038188 | | 2/2004 |
| JP | 2006-030782 | | 2/2007 |
| JP | 2007-047576 | | 2/2007 |
| JP | 2007-114477 | A | 5/2007 |
| JP | 2007-149688 | | 6/2007 |
| JP | 2007-316511 | A | 12/2007 |
| JP | 2008-040478 | | 2/2008 |
| JP | 2008-065200 | | 3/2008 |
| JP | 2008-262013 | | 10/2008 |
| JP | 2009-003473 | | 1/2009 |
| JP | 4222396 | B2 | 2/2009 |
| JP | 2009-151098 | A | 7/2009 |
| JP | 2009-288733 | A | 12/2009 |
| JP | 2009-288773 | A | 12/2009 |
| JP | 2010-003880 | A | 1/2010 |
| JP | 2011-209369 | | 10/2011 |
| JP | 2012-247808 | A | 12/2012 |
| JP | 2013-97093 | A | 5/2013 |
| KR | 10-2008-0000097 | A | 1/2008 |
| KR | 10-2008-0024009 | A | 3/2008 |
| KR | 10-2008-0059928 | A | 7/2008 |
| KR | 10-2008-0100533 | | 11/2008 |
| KR | 10-0932989 | B1 | 12/2009 |
| KR | 10-2010-0091104 | | 8/2010 |
| KR | 10-1022156 | B1 | 3/2011 |
| KR | 10-1156447 | B1 | 6/2012 |
| KR | 10-2012-0140489 | A | 12/2012 |
| TW | 200540747 | A | 12/2005 |
| WO | WO 2004/068446 | | 8/2004 |
| WO | WO 2012/001740 | A1 | 1/2012 |
| WO | WO 2012/137817 | | 10/2012 |

OTHER PUBLICATIONS

KIPO Office action dated Jul. 15, 2014, for Korean priority Patent application 10-2013-0068638, (5 pages).

Chinese Office Action dated Nov. 2, 2022 issued in corresponding Application No. CN 201910497898.0, 5 pages.

Chinese Office action issued in corresponding application No. 201910497254.1, dated Jan. 31, 2023, 7 pages.

EPO Search Report dated Feb. 6, 2015, for corresponding European Patent application 14169289.7, (30 pages).

English machine translation of International Publication WO 2012/001740 dated Jan. 5, 2012, listed above, (12 pages).

EPO Partial Search Report dated Sep. 30, 2014, corresponding to European Patent application 14169289.7, (12 pages).

* cited by examiner

ORGANIC LIGHT-EMITTING DISPLAY APPARATUS AND METHOD OF REPAIRING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application claims priority to and the benefit of Korean Patent Application Nos. 10-2013-0057959 and 10-2013-0068638, filed on May 22, 2013 and Jun. 14, 2013, respectively, in the Korean Intellectual Property Office, the disclosures of which are incorporated herein in their entirety by reference.] *This application is a reissue application of U.S. Pat. No. 9,911,799, issued on Mar. 6, 2018, which claims priority to and the benefit of Korean Patent Application Nos. 10-2013-0057959 and 10-2013-0068638, filed on May 22, 2013 and Jun. 14, 2013, respectively, in the Korean Intellectual Property Office, the disclosures of which are incorporated herein in their entirety by reference.*

BACKGROUND

1. Field

Embodiments of the present invention relate to an organic light-emitting display apparatus and a method of repairing the same.

2. Description of the Related Art

In an organic light-emitting display apparatus, when a pixel is defective, the pixel may emit light all the time or may display black (e.g., may not emit light), regardless of a scan signal and a data signal applied to the pixel. Pixels that emit light all the time, regardless of the scan or data signals, are regarded as bright spots (or hot spots). By contrast, pixels that do not emit light (e.g., displayed in black), regardless of the scan or data signals, is regarded as a dark spot (or a black spot).

As a circuit in the pixel becomes more complex, bright spots or dark spots due to circuit defects may not be easily solved or prevented.

SUMMARY

Embodiments of the present invention provide a display apparatus for forming a redundancy pattern in each column of pixels on a panel and normally driving a defective pixel by using the redundancy pattern.

According to an embodiment of the present invention, there is provided An organic light-emitting display apparatus including: an emission device including a plurality of sub-emission devices; an emission pixel circuit configured to supply a driving current to the emission device; a dummy pixel circuit configured to supply the driving current to the emission device; and a repair line coupling the emission device to the dummy pixel circuit, wherein the emission device is configured to receive the driving current from the emission pixel circuit or the dummy pixel circuit.

Each of the plurality of sub-emission devices may include: a lower electrode among a plurality of separated lower electrodes; an upper electrode commonly facing the plurality of separated lower electrodes; and an emission layer between the lower electrode and the upper electrode, wherein the plurality of separated lower electrodes are electrically coupled to each other through an electrode connection wiring.

The electrode connection wiring may include at least one of metal, amorphous silicon, crystalline silicon, and an oxide semiconductor.

The electrode connection wiring may be at a same layer and of a same material as an active layer of the emission pixel circuit.

The electrode connection wiring may be integrally formed with the plurality of separated lower electrodes.

The electrode connection wiring may include: a plurality of first connection units coupled to the plurality of separated lower electrodes; a second connection unit coupled to the emission pixel circuit; and a plurality of cut nodes between the first connection units and the second connection unit, wherein the cut nodes are cut to electrically isolate the plurality of separated lower electrodes from each other.

The electrode connection wiring may be coupled to the plurality of separated lower electrodes in each of the first connection units through a first contact hole and may be coupled to the emission pixel circuit through a second contact hole in the second connection unit.

The organic light-emitting display apparatus may further include at least one circuit wiring having one end coupled to the emission pixel circuit and another end coupled to the second connection unit, wherein the at least one circuit wiring may be configured to be cut to electrically isolate the emission pixel circuit from the emission device.

The organic light-emitting display apparatus may further include a first repair connection wiring having one end coupled to the repair line and another end overlapping with a first short wiring coupled to one of the first connection units; and an insulating layer between the first repair connection wiring and the first short wiring, wherein the first repair connection wiring is configured to be coupled to the first short wiring utilizing a laser beam.

Each of the first repair connection wiring and the first short wiring may be at a same layer and of a same material as respective conductive layers formed on different layers of the emission pixel circuit.

The dummy pixel circuit may be on at least one row among first and last rows of each column, or at least one column among first and last columns of each row.

The emission pixel circuit may be in a display area and the dummy pixel circuit is in a non-display area.

The emission pixel circuit and the dummy pixel circuit may have a same component structure and function.

The dummy pixel circuit may be coupled to the emission device through a second repair connection wiring having one end coupled to the repair line and another end overlapping with a second short wiring coupled to the dummy pixel circuit, wherein an insulating layer may be between the second repair connection wiring and the second short wiring.

The repair line may be coupled to a power voltage line through a power connection wiring and may be configured to be electrically isolated from the power voltage line by cutting the power connection wiring.

The repair line may be in each column or row.

The emission pixel circuit may include: a first transistor configured to transfer a data signal in response to a scan signal; a capacitor configured to be charged with a voltage corresponding to the data signal; and a second transistor configured to transfer a driving current corresponding to the voltage charged in the capacitor to the emission device.

The emission pixel circuit may include: a first transistor configured to receive a data signal from a data line in response to a scan signal; a second transistor configured to transfer a driving current corresponding to the data signal to the emission device; a third transistor configured to diode-connect the second transistor; a first capacitor configured to be charged with a voltage corresponding to the data signal; and a second capacitor connected to one electrode of the first capacitor and a gate electrode of the second transistor.

The emission pixel circuit may further include: a fourth transistor connected to between the first transistor and the one electrode of the first capacitor; a fifth transistor connected to between the data line and the one electrode of the first capacitor; and a third capacitor having one electrode connected to a node between the first transistor and the fourth transistor and another electrode connected to a gate electrode of the fifth transistor.

The emission pixel circuit may include: a first transistor configured to receive a data signal from a data line in response to a scan signal; a second transistor configured to transfer a driving current corresponding to the data signal to the emission device; a third transistor configured to diode-connect the second transistor; a fourth transistor connected to between the first transistor and the second transistor; a fifth transistor connected to between the second transistor and the emission device; a sixth transistor connected to between a gate electrode of the second transistor and an initial power; a first capacitor connected to between the gate electrode of the second transistor and a first power source; and a second capacitor having one electrode connected to a node between the first transistor and the fourth transistor and another electrode connected to a second power source.

The dummy pixel circuit may be configured to supply the driving current to the emission device at a predetermined time.

The dummy pixel circuit may be configured to supply a same data signal as that supplied by the emission pixel circuit to the emission device.

The plurality of sub-emission devices may include: a first sub-emission device including a first lower electrode, an upper electrode facing the first lower electrode, and a first emission layer between the first lower electrode and the upper electrode; and a second sub-emission device including a second lower electrode, the upper electrode facing the second lower electrode, and a second emission layer between the second lower electrode and the upper electrode, wherein the first lower electrode and the second lower electrode are coupled to each other through an electrode connection wiring.

The electrode connection wiring may include: a first connection unit coupled to the first lower electrode; a second connection unit coupled to the second lower electrode; a third connection unit coupled to the emission pixel circuit; a first node between the first connection unit and the third connection unit and configured to be cut to electrically isolate the first sub-emission device from the emission pixel circuit; and a second node between the second connection unit and the third connection unit and configured to be cut to electrically isolate the second sub-emission device from the emission pixel circuit.

The organic light-emitting display apparatus may further include a first repair connection wiring having one end coupled to the repair line and another end overlapping with a first short wiring coupled to the first connection unit; a first insulating layer between the first repair connection wiring and the first short wiring, wherein the first repair connection wiring is configured to be coupled to the first short wiring utilizing a laser beam; a second repair connection wiring having one end coupled to the repair line and another end overlapping with a second short wiring coupled to the dummy pixel circuit; and a second insulating layer between the second repair connection wiring and the second short wiring, wherein the second repair connection wiring is configured to be coupled to the second short wiring utilizing the laser beam.

According to another embodiment of the present invention there is provided a method of repairing a defective pixel in an organic light emitting display apparatus, the organic light emitting display apparatus including a plurality of emission pixels including an emission device including a plurality of sub-emission devices, the sub-emission devices being configured to receive a corresponding driving current from one of an emission pixel circuit and a dummy pixel circuit, the method including: connecting the defective pixel to the dummy pixel circuit through a repair line; and after connecting the defective pixel to the dummy pixel circuit, if the defective pixel does not normally emit light, separating the plurality of sub-emission devices.

The separating of the plurality of sub-emission devices may include: cutting between a connection unit of the emission pixel circuit and a connection unit of each of lower electrodes of the plurality of sub-emission devices in an electrode connection wiring that couples the lower electrodes to each other.

The method may further include after coupling the defective pixel to the dummy pixel circuit, if the defective pixel normally emits light, separating the emission pixel circuit and the emission device from each other.

The separating of the emission pixel circuit and the emission device may include: cutting at least one wiring coupled between the emission pixel circuit and the lower electrodes of the emission device.

The coupling of the defective pixel to the dummy pixel circuit may include: shorting a first short wiring coupled to the emission device and a second short wiring coupled to the dummy pixel circuit by: irradiating a laser beam onto a first repair connection wiring having one end coupled to the repair line and another end overlapping with the first short wiring, wherein a first insulating layer is between the first repair connection wiring and the first short wiring, and irradiating the laser beam onto a second repair connection wiring having one end coupled to the repair line and another end overlapping with the second short wiring with a second insulating layer between the second repair connection wiring and the second short wiring.

The method may further include separating a defective sub-emission device among a plurality of sub-emission devices of the defective pixel from the other sub-emission devices.

The separating of the defective sub-emission device among the plurality of sub-emission devices of the defective pixel from the other sub-emission devices may include: cutting between a connection unit of a lower electrode of the defective sub-emission device and a connection unit of the emission pixel circuit in an electrode connection wiring that couples lower electrodes of the plurality of sub-emission devices to each other.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
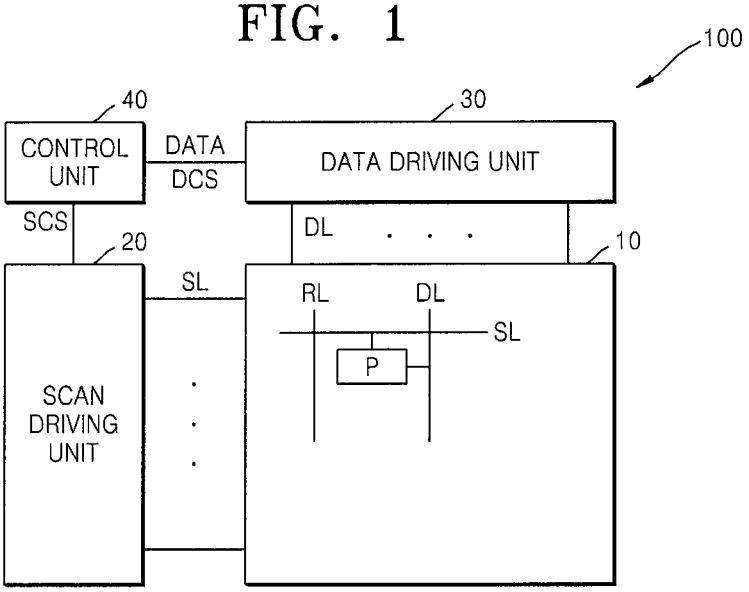
FIG. 1 is a block diagram of a display apparatus according to an embodiment of the present invention.

Hereinafter, embodiments of the present invention will be described in some detail by explaining embodiments of the invention with reference to the attached drawings. Like reference numerals in the drawings denote like elements. In the following description of the present invention, a detailed description of known functions and configurations incorporated herein will be omitted when it may make the subject matter of the present invention unclear.

In the drawings, the thicknesses of layers and regions are exaggerated for clarity. It will be understood that when a layer is referred to as being "on" another layer or substrate, it can be directly on the other layer or substrate, or intervening layers may also be present.

It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. Also, the term "on" refers to an upper or lower side of a target and does not always mean an upper side in a direction of gravity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a display apparatus 100 according to an embodiment of the present invention.

Referring to FIG. 1, the display apparatus 100 includes a display panel 10 including a plurality of pixels, a scan driving unit 20, a data driving unit 30, and a control unit 40. The scan driving unit 20, the data driving unit 30, and the control unit 40 may be separately formed on different semiconductor chips, or may be integrated on a single semiconductor chip. Also, the scan driving unit 20 may be formed on the same substrate as the display panel 10.

A plurality of scan lines SL extending in a horizontal direction and a plurality of the data lines DL extending in a vertical direction and perpendicularly crossing the scan lines SL are formed on the display panel 10. Also, a plurality of repair lines RL extending almost parallel or substantially parallel with and spaced apart from the data lines DL and perpendicularly crossing the scan lines SL are formed on the display panel 10. A plurality of pixels P aligned in a matrix-like shape are formed where the scan lines SL, the data lines DL, and the repair lines RL cross each other.

Although the data line DL is formed at a right side of the pixel P and the repair line RL is formed at a left side of the pixel P in FIG. 1, the present invention is not limited thereto. For example, the positions of the data line DL and the repair line RL may be switched according to the design and function of the display panel 10. One or more repair lines RL may be formed in each pixel column. The one or more repair lines RL may be formed or arranged in parallel to the scan lines SL according to a pixel design so that the one or more repair lines RL may be formed or arranged in each pixel row. Although not shown in FIG. 1, additional signal or voltage lines such as a plurality of emission control lines for providing an emission control signal, an initialization voltage line for providing an initialization voltage, and a driving voltage line for providing a power voltage may be additionally formed or arranged on the display panel 10.

The scan driving unit 20 may generate and sequentially provide scan signals via the scan lines SL to the display panel 10.

The data driving unit 30 may sequentially provide data signals via the data lines DL to the display panel 10. The data driving unit 30 transforms input image data DATA, input from the control unit 40 and having a grayscale (e.g., grey levels), into a voltage or current data signal.

The control unit 40 generates and transmits a scan control signal SCS and a data control signal DCS respectively to the scan driving unit 20 and the data driving unit 30. As such, the scan driving unit 20 sequentially provides or activates scan signals to the scan lines SL, and the data driving unit 30 provides data signals to the pixels P. Additional voltage or control signals such as a first power voltage ELVDD, a second power voltage ELVSS, an emission control signal EM, and an initialization voltage Vint may be provided to the pixels P under the control of the control unit 40. The control unit 40 may control a time when the scan driving unit 20 provides a scan signal to a dummy pixel and may control the data driving unit 30 to provide a data signal that is the same as the data signal provided or to be provided to a defective signal, to the dummy pixel when the scan signal is provided to the dummy pixel.

Figure 2:
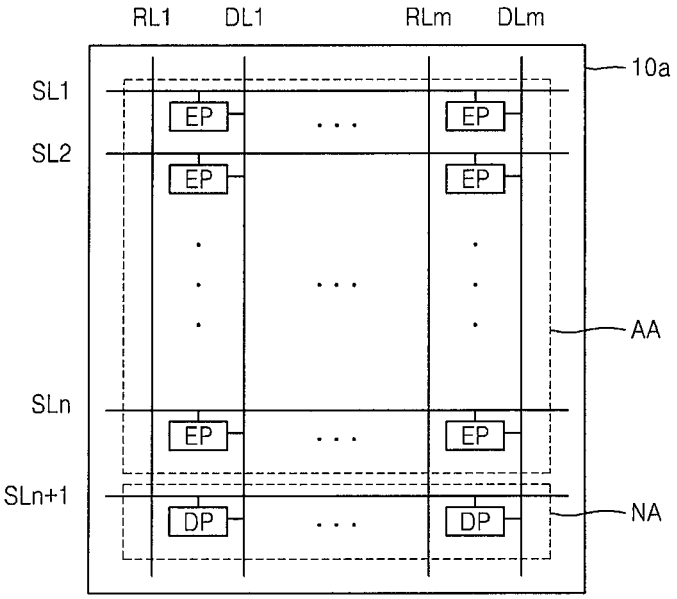
FIGS. 2 through 4 are schematic diagrams of examples of a display panel illustrated in FIG. 1.
Figure 3:
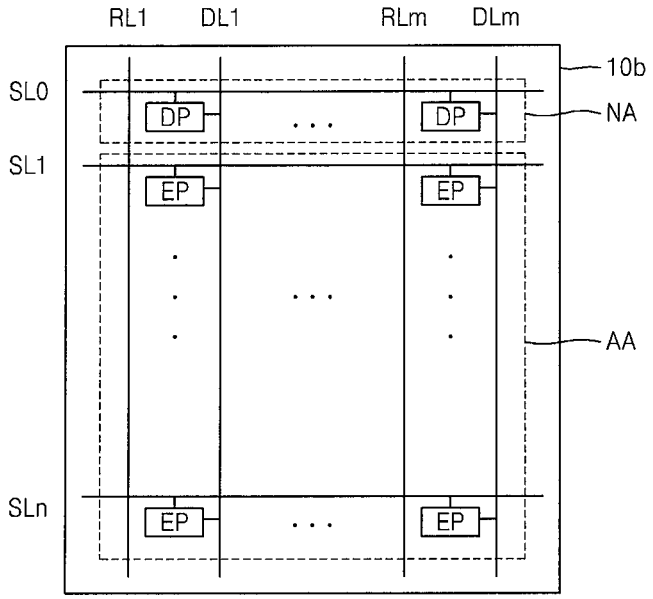
Figure 4:
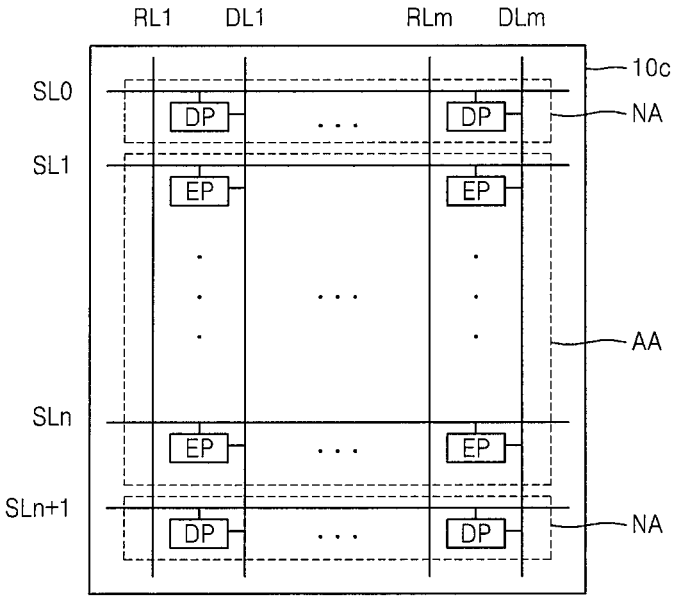

FIGS. 2 through 4 are schematic diagrams of examples of the display panel 10 illustrated in FIG. 1.

Referring to FIGS. 2 through 4, a plurality of pixels P aligned in a matrix-like shape are formed where a plurality of scan lines SL, a plurality of data lines DL, and a plurality of repair lines RL cross each other, on a display panel 10a, 10b, or 10c. The pixels P include emission pixels EP formed on a display area AA and dummy pixels DP formed on a non-display area NA. The non-display area NA may be formed on at least one of top and bottom regions or left and right regions of the display area AA. As such, one or more dummy pixels DP may be formed in each pixel column on at least one of top and bottom regions of the pixel column, or one or more dummy pixels DP may be formed in each pixel row on at least one of left and right regions of the pixel row. An example of forming the dummy pixels DP in the pixel column of the non-display area NA on the top and bottom regions of the display area AA is explained with respect to FIGS. 2 through 4. This may apply to a case where the dummy pixels DP are formed in the pixel row of the non-display area NA on the left and right regions of the display area AA.

Referring to FIG. 2, the display panel 10a includes a display area AA and a non-display area NA formed below the display area AA. From among first through (n+1)th scan lines SL1 through SLn+1, the first through nth scan lines SL1 through SLn are formed on the display area AA, and the (n+1)th scan line SLn+1 is formed on the non-display area NA. First through mth data lines DL1 through DLm and first through mth repair lines RL1 through RLm are formed separately in pixel columns in the display area M and extending into the non-display area NA. A plurality of emission pixels EP coupled to the first through nth scan lines SL1 through SLn and the first through mth data lines DL1 through DLm are formed in the display area AA, and a plurality of dummy pixels DP coupled to the (n+1)th scan line SLn+1 and the first through mth data lines DL1 through DLm are formed in the non-display area NA.

Referring to FIG. 3, the display panel 10b includes a display area AA and a non-display area NA above the display area AA. From among zeroth through nth scan lines SL0 through SLn, the first through nth scan lines SL1 through SLn are formed on the display area AA, and the zeroth scan line SL0 is formed on the non-display area NA. First through mth data lines DL1 through DLm and first through mth repair lines RL1 through RLm are formed separately in pixel columns in the display area AA and extending into the non-display area NA. A plurality of emission pixels EP coupled to the first through nth scan lines SL1 through SLn and the first through mth data lines DL1 through DLm are formed in the display area AA, and a plurality of dummy pixels DP coupled to the zeroth scan line SL0 and the first through mth data lines DL1 through DLm are formed in the non-display area NA.

Referring to FIG. 4, the display panel 10c includes a display area AA and a non-display area NA formed above and below the display area AA. From among zeroth through (n+1)th scan lines SL0 through SLn+1, the first through nth scan lines SL1 through SLn are formed on the display area AA, and the zeroth and (n+1)th scan lines SL0 and SLn+1 are formed on the non-display area NA. First through mth data lines DL1 through DLm and first through mth repair lines RL1 through RLm are formed separately in pixel columns on the display area AA and the non-display area NA. A plurality of emission pixels EP coupled to the first through nth scan lines SL1 through SLn and the first through mth data lines DL1 through DLm are formed on the display area AA, and a plurality of dummy pixels DP coupled to the zeroth and (n+1)th scan lines SL0 and SLn+1 and the first through mth data lines DL1 through DLm are formed on the non-display area NA.

Figure 5:
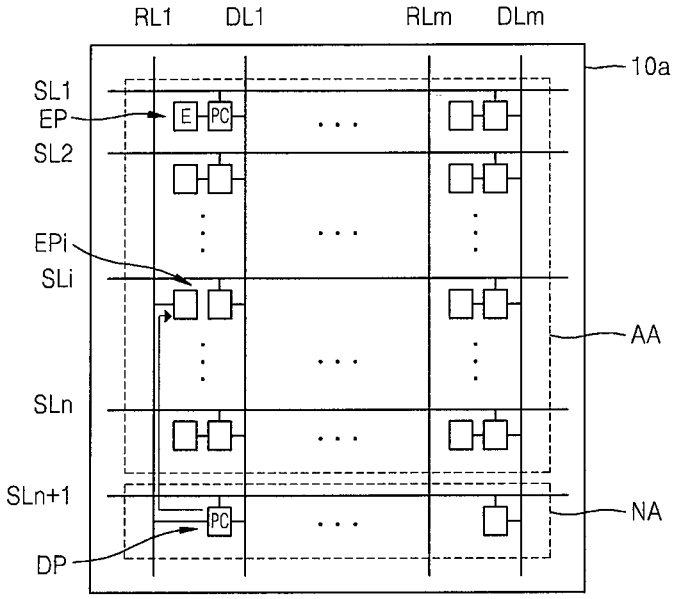
FIG. 5 is a diagram for describing a method of repairing a defective pixel by using a plurality of repair lines of the display panel of FIG. 2, according to an embodiment of the present invention.

FIG. 5 is a diagram for describing a method of repairing a defective pixel by using repair lines of the display panel 10a of FIG. 2, according to an embodiment of the present invention.

Referring to FIG. 5, the emission pixels EP formed in the display area AA may include pixel circuits PC that are coupled to the first through nth scan lines SL1 through SLn and the first through mth data lines DL1 through DLm, and emission devices E that emit light by receiving a driving current from the pixel circuits PC. The dummy pixels DP formed in the non-display area NA may include only the pixel circuits PC that are coupled to the (n+1)th scan line SLn+1 and the first through mth data lines DL1 through DLm.

When an emission pixel EPi coupled to an ith scan line SLi of a first column is defective, the emission device E of the defective emission pixel EPi is disconnected from the corresponding pixel circuit PC, and the disconnected emission device E is coupled to the pixel circuit PC of the dummy pixel DP that is coupled to the (n+1)th scan line SLn+1 through the repair line RL. The disconnection of the emission device E and the corresponding pixel circuit PC, the coupling of the repair line RL and the emission device E, and the coupling of the repair line RL and the dummy pixel DP may be performed by cutting or shorting by irradiating a laser beam from a substrate side or from an opposite side of a substrate.

Figure 6:
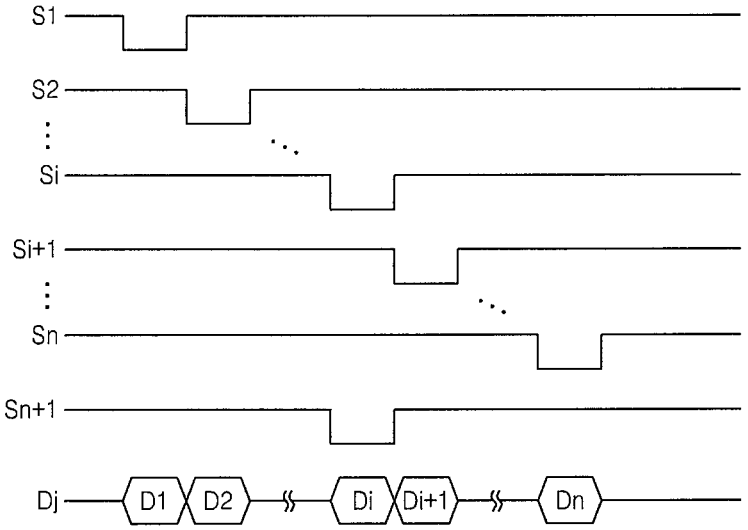
FIGS. 6 and 7 show waveforms of scan signals and data signals provided to the display panel repaired by using the method illustrated in FIG. 5.
Figure 7:
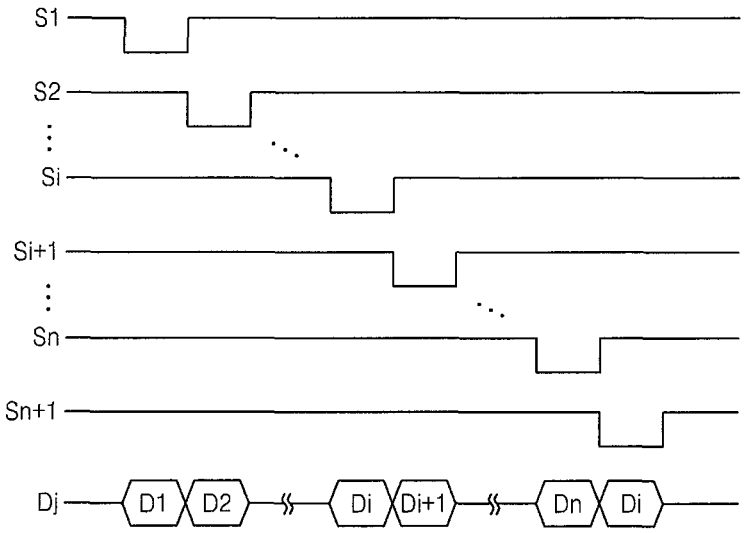

FIGS. 6 and 7 show waveforms of scan signals and data signals provided to the display panel repaired by using the method illustrated in FIG. 5.

Referring to FIG. 6, the scan driving unit 20 sequentially provides or activates the first through nth scan signals S1 through Sn to first through nth scan line SL1 through SLn and provides the (n+1)th scan signal Sn+1 to the (n+1)th scan line SLn+1 at the same time as the scan signal Si is provided to the repaired emission pixel EPi.

The data driving unit 30 sequentially provides or activates the first through nth data signals D1 through Dn to the data line DL1 in synchronization with the first through (n+1)th scan signals S1 through Sn+1. In this regard, a data signal Di that is the same as the data signal Di provided to the defective emission pixel EPi is concurrently provided to the dummy pixel DP. Accordingly, the emission device E of the defective emission pixel EPi may receive a current corresponding to the data signal Di via the pixel circuits PC of the dummy pixels DP and the repair lines RL1, thereby suppressing or reducing generation of a bright spot or a dark spot of the defective emission pixel EPi.

Referring to FIG. 7, the scan driving unit 20 sequentially provides or activates the first through (n+1)th scan signals S1 through Sn+1 to the first through (n+1)th scan lines SL1 through SLn+1.

The data driving unit 30 sequentially provides or activates the first through nth data signals D1 through Dn to the data line DL1 in synchronization with the first through (n+1)th scan signals S1 through Sn+1. In this regard, a data signal Di that is the same as the data signal Di provided to the defective emission pixel EPi is again provided to the dummy pixel DP. Accordingly, the emission device E of the defective emission pixel EPi may receive a current corresponding to the data signal Di via the pixel circuits PC of the dummy pixels DP and the repair lines RL1, thereby suppressing or reducing generation of a bright spot or a dark spot of the defective emission pixel EPi.

Although a width of the first through (n+1)th scan signals S1 through Sn+1 may be provided as one horizontal period (1H) in FIGS. 6 and 7, a width of a scan signal may be provided as two horizontal periods (2H), and widths of adjacent scan signals, for example, widths of the (n−1)th scan signal Sn−1 and the nth scan signal Sn, may be provided to overlap by 1H or less. Accordingly, a lack of charges due to a resistive-capacitive (RC) delay of signal lines caused by a large-sized display area may be solved or reduced.

Figure 8:
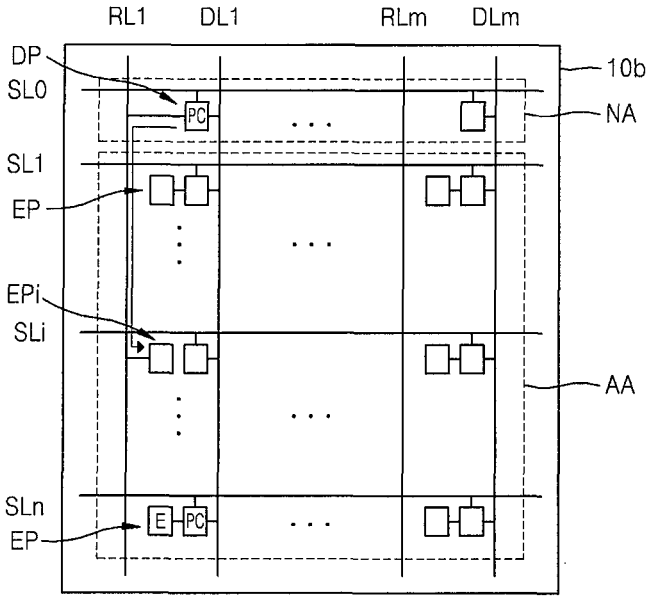
FIG. 8 is a diagram for describing a method of repairing a defective pixel by using a plurality of repair lines of the display panel of FIG. 3, according to another embodiment of the present invention.

FIG. 8 is a diagram for describing a method of repairing a defective pixel by using the repair lines of the display panel 10b of FIG. 3, according to another embodiment of the present invention.

Referring to FIG. 8, the emission pixels EP formed in the display area AA may include the pixel circuits PC and the emission devices E that emit light by receiving a driving current from the pixel circuits PC. The dummy pixels DP formed in the non-display area NA may include only the pixel circuits PC.

When the emission pixel EPI coupled to the ith scan line SLi of a first column is defective, the emission device E of the defective emission pixel EPi is disconnected from the pixel circuit PC, and the disconnected emission device E is coupled to the pixel circuit PC of the dummy pixel DP that is coupled to the zeroth scan line SL0 through the repair line RL1. The disconnection of the emission device E and the pixel circuit PC, the coupling of the repair line RL and the emission device E, and the coupling of the repair line RL and the dummy pixel DP may be performed by cutting or shorting by irradiating a laser beam from a substrate side or from an opposite side of a substrate.

Figure 9:
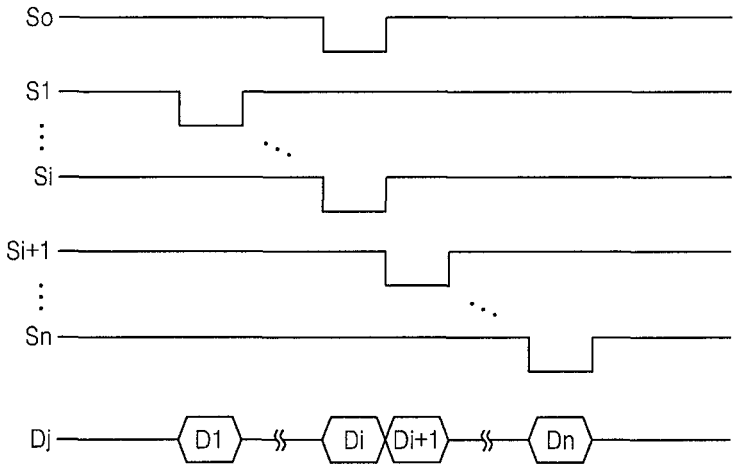
FIGS. 9 and 10 show waveforms of scan signals and data signals provided to the display panel repaired by using the method illustrated in FIG. 8.
Figure 10:
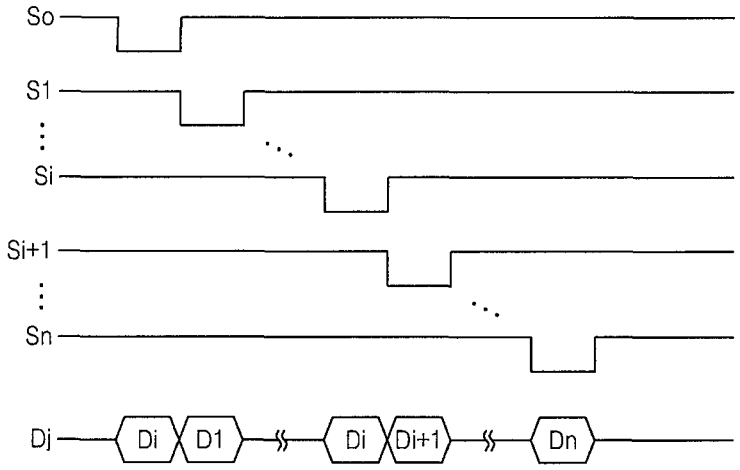

FIGS. 9 and 10 show waveforms of scan signals and data signals provided to the display panel 10b repaired by using the method illustrated in FIG. 8.

Referring to FIG. 9, the scan driving unit 20 sequentially provides or activates the first through nth scan signals S1 through Sn to the first through nth scan line SL1 through SLn and provides the zeroth scan signal S0 to the zeroth scan line S0 at the same time as the scan signal Si is provided to the repaired emission pixel EPi.

The data driving unit 30 sequentially provides or activates the first through nth data signals D1 through Dn to the data line DL1 in synchronization with the zeroth through nth scan signals S0 through Sn. In this regard, the data signal Di that is the same as the data signal Di provided to the defective emission pixel EPi is concurrently provided to the dummy pixel DP. Accordingly, the emission device E of the defective emission pixel EPi may receive a current corresponding to the data signal Di via the pixel circuits PC of the dummy pixels DP and the repair lines RL1, thereby suppressing or reducing generation of a bright spot or a dark spot of the defective emission pixel EPi.

Referring to FIG. 10, the scan driving unit 20 sequentially provides or activates the zeroth through nth scan signals S0 through Sn to the zeroth through nth scan lines SL0 through SLn.

The data driving unit 30 sequentially provides or activates the first through nth data signals D1 through Dn to the data line DL1 in synchronization with the zeroth through nth scan signals S0 through Sn. In this regard, the data signal Di that is the same as the data signal Di that is to be provided to the defective emission pixel EPi is first provided to the dummy pixel DP. Accordingly, the emission device E of the defective emission pixel EPi may receive a current corresponding to the data signal Di via the pixel circuits PC of the dummy pixels DP and the repair lines RL1, thereby suppressing or reducing generation of a bright spot or a dark spot of the defective emission pixel EPi.

Although a width of the zeroth through nth scan signals S0 through Sn may be provided as one horizontal period (1H) in FIGS. 9 and 10, a width of a scan signal may be provided as two horizontal periods (2H), and widths of adjacent scan signals, for example, widths of the (n−1)th scan signal Sn−1 and the nth scan signal Sn, may be provided to overlap by 1H or less. Accordingly, a lack of charges due to a RC delay of signal lines caused by a large-sized display area may be solved or reduced.

Figure 11:
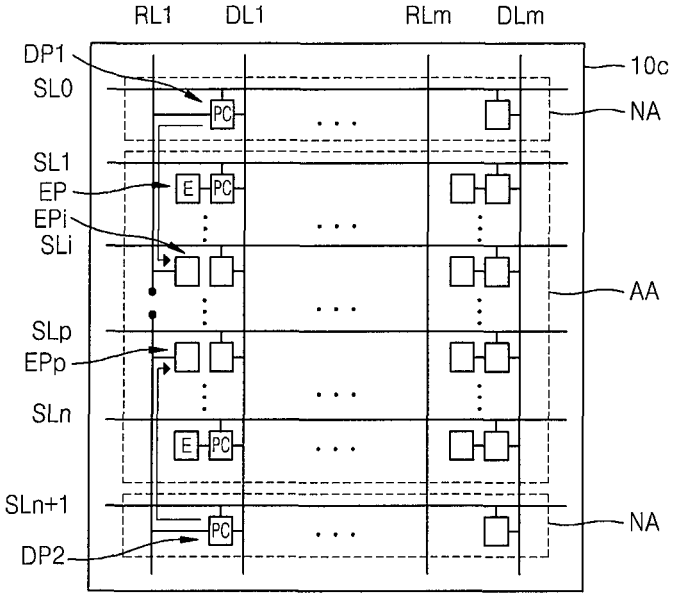
FIG. 11 is a diagram for describing a method of repairing a defective pixel by using a plurality of repair lines of the display panel of FIG. 4, according to another embodiment of the present invention.

FIG. 11 is a diagram for describing a method of repairing a defective pixel by using repair lines of the display panel 10C of FIG. 4, according to another embodiment of the present invention.

Referring to FIG. 11, the emission pixels EP formed in the display area AA may include the pixel circuits PC and the emission devices E that emit light by receiving a driving current from the pixel circuits PC. The dummy pixels DP formed in the non-display area NA may include only the pixel circuits PC.

When the emission pixel EPi coupled to the ith scan line SLi of a first column and an emission pixel EPp coupled to a pth scan line SLp of the first column are defective, the repair line RL1 between the defective emission pixels EPi and EPp is disconnected, the emission devices E of the defective emission pixels EPi and EPp are disconnected from the pixel circuits PC, and the disconnected emission devices E are coupled to the pixel circuits PC of a first dummy pixel DP1 and a second dummy pixie DP2 that are respectively coupled to the zeroth scan line SL0 and the (n+1)th scan line SLn+1 through the repair lines RL1. The disconnection of the emission devices E and the pixel circuits PC, the coupling of the repair lines RL and the emission devices E, and the coupling of the repair lines RL and the dummy pixels DP may be performed by cutting or shorting by irradiating a laser beam from a substrate side or from an opposite side of a substrate.

Figure 12:
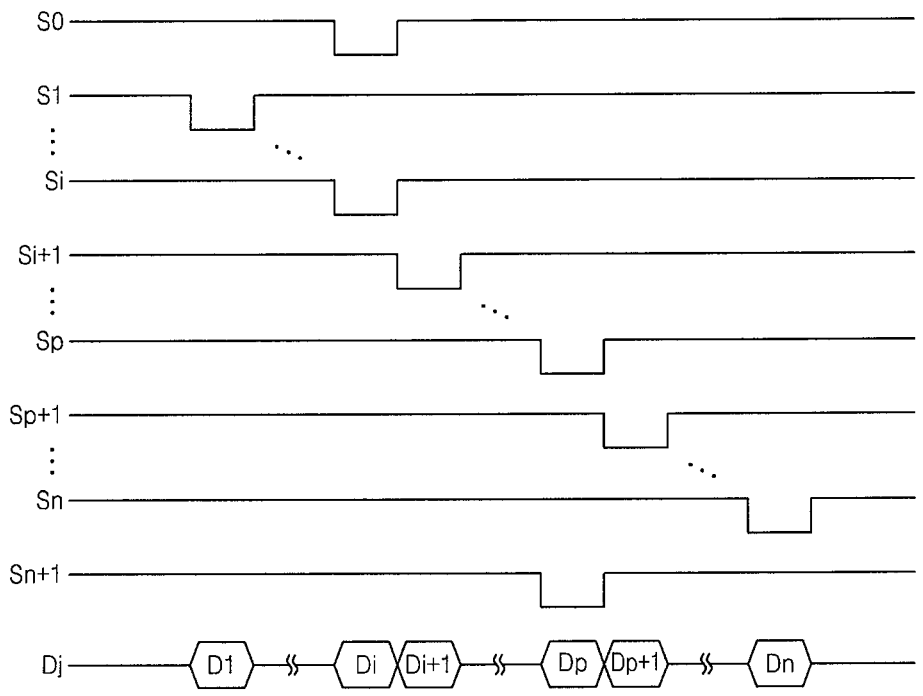
FIGS. 12 and 13 show waveforms of scan signals and data signals provided to the display panel repaired by using the method illustrated in FIG. 11.
Figure 13:
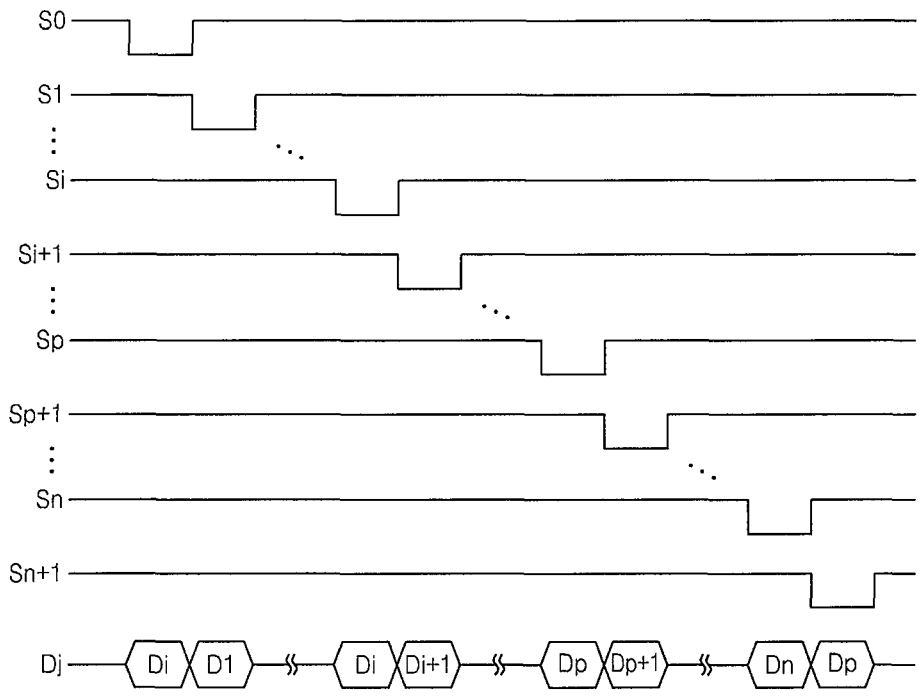

FIGS. 12 and 13 show waveforms of the scan signals and the data signals provided to the display panel 10c repaired by using the method illustrated in FIG. 11.

Referring to FIG. 12, the scan driving unit 20 sequentially provides or activates the first through nth scan signals S1 through Sn to the first through nth scan line SL1 through SLn and respectively provides the zeroth and (n+1)th scan signals S0 and Sn+1 to the zeroth and (n+1)th scan line SL0 and SLn+1 at the same time as the scan signals Si and Sp are respectively provided to the repaired emission pixels EPi and EPp.

The data driving unit 30 sequentially provides or activates the first through nth data signals D1 through Dn to the data line DL1 in synchronization with the zeroth through (n+1)th scan signals S0 through Sn+1. In this regard, the data signals Di and Dp that are the same as the data signals Di and Dp provided to the defective emission pixels EPi and EPp are concurrently provided to the first and second dummy pixels DP1 and DP2. Accordingly, the emission devices E of the defective emission pixels EPi and EPp may receive current corresponding to the data signals Di and Dp via the pixel circuits PC of the first and second dummy pixels DP1 and DP2 and the repair lines RL1, thereby suppressing or reducing generation of a bright spot or a dark spot of the defective emission pixels EPi and EPp.

Referring to FIG. 13, the scan driving unit 20 sequentially provides or activates the zeroth through (n+1)th scan signals S0 through Sn+1 to the zeroth through (n+1)th scan line SL0 through SLn+1.

The data driving unit 30 sequentially provides or activates the first through nth data signals D1 through Dn to the data line DL1 in synchronization with the zeroth through (n+1)th scan signals S0 through Sn+1. In this regard, the data signal Di that is the same as the data signal Di that is to be provided to the defective emission pixel EPi is first provided to the first dummy pixel DP1. The data signal Dp that is the same as the data signal Dp provided to the defective emission pixel EPp is again provided to the second dummy pixel DP2. Accordingly, the emission devices E of the defective emission pixels EPi and EPp may receive current corresponding to the data signals Di and Dp via the pixel circuits PC of the first and second dummy pixels DP1 and DP2 and the repair lines RL1, thereby suppressing or reducing generation of a bright spot or a dark spot of the defective emission pixels EPi and EPp.

Although a width of the zeroth through (n+1)th scan signals S0 through Sn+1 may be provided as one horizontal period (1H) in FIGS. 12 and 13, a width of a scan signal may be provided as two horizontal periods (2H), and widths of adjacent scan signals (for example, widths of the (n−1)th scan signal Sn−1 and the nth scan signal Sn) may be provided to overlap by 1H or less. Accordingly, a lack of charges due to a RC delay of signal lines caused by a large-sized display area may be solved.

Figure 14:
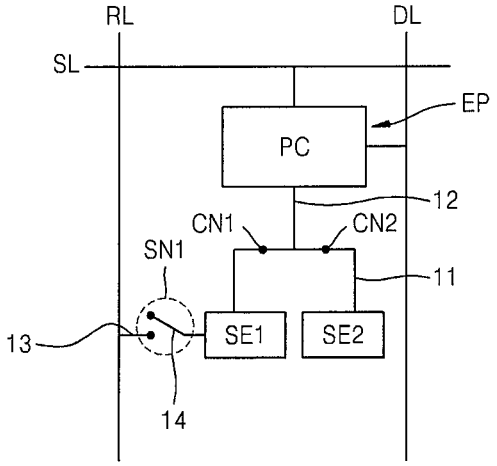
FIG. 14 is a schematic diagram of an emission pixel according to an embodiment of the present invention.
Figure 15:
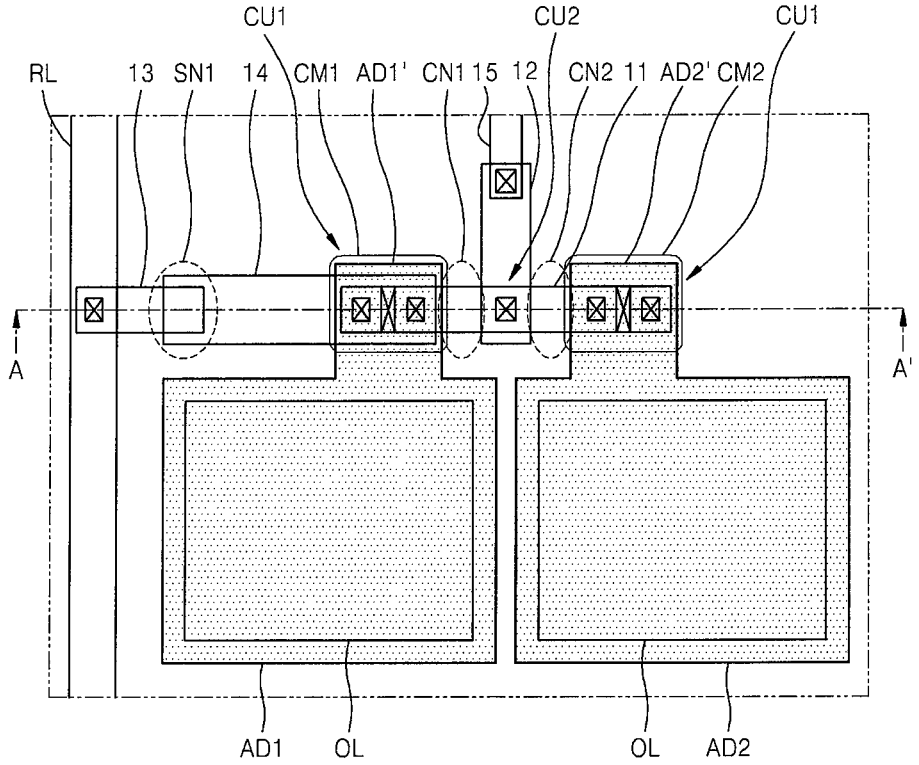
FIG. 15 is a plan view of an emission device of the emission pixel of FIG. 14.
Figure 16:
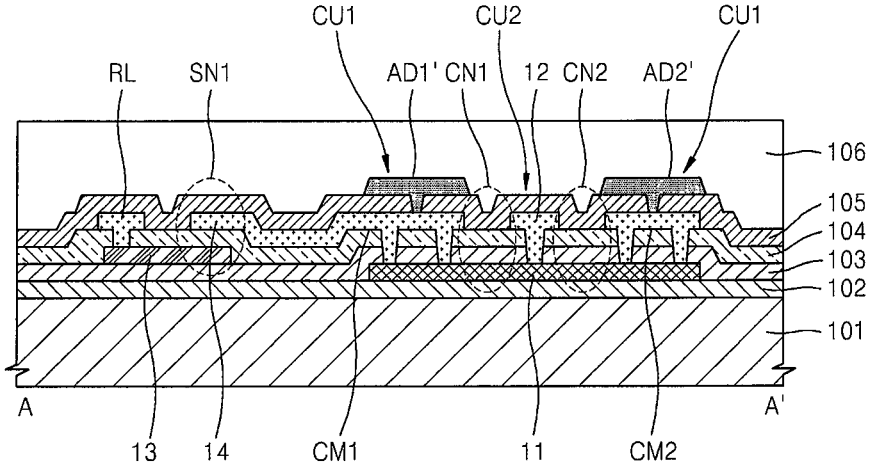
FIG. 16 is a cross-sectional view taken along the line A-A' of FIG. 15.

FIG. 14 is a schematic diagram of the emission pixel EP according to an embodiment of the present invention. FIG. 15 is a plan view of an emission device of the emission pixel EP of FIG. 14. FIG. 16 is a cross-sectional view taken along a line A-A' of FIG. 15.

Referring to FIG. 14, the emission pixel EP that is coupled to the scan line SL and the data line DL may include the pixel circuit PC and the emission device E that emits light by receiving a driving current from the pixel circuit PC. The pixel circuit PC may include at least one thin film transistor (TFT) and at least one capacitor. The emission device E may be an organic light emitting diode (OLED) including an anode, a cathode, and an emission layer formed or located between the anode and the cathode. The anode of the emission device E may be split or separated (e.g., physically separated by a gap or space) into at least two anodes so that the emission device E may include at least two sub-emission devices SE1 and SE2.

Referring to FIGS. 15 and 16, the first sub-emission device SE1 includes a first anode AD1, an organic layer OL including an emission layer, and a cathode (not shown). The second sub-emission device SE2 includes a second anode AD2, the organic layer OL including the emission layer, and a cathode. The organic layer OL may be separately or commonly formed in the first and second sub-emission devices SE1 and SE2. The cathode may be commonly formed in the first and second sub-emission devices SE1 and SE2, and may be formed on an entire surface of a substrate 101 so that the cathode may be commonly formed in the first anode AD1 and the second anode AD2 to face each other.

An electrode connection wiring 11 is formed on the substrate 101 and a buffer layer 102. The electrode connection wiring 11 may be formed of a conductive material. For example, the electrode connection wiring 11 may be formed of amorphous silicon, crystalline silicon, or an oxide semiconductor. In this case, the electrode connection wiring 11 may be formed on the same layer and of the same material as an active layer included in the TFT of the pixel circuit PC. The electrode connection wiring 11 may be formed of metal. In this case, the electrode connection wiring 11 may have a single layer structure including metal, semitransparent metal, or a transparent conductive oxide or a three layer structure including the semitransparent metal and the transparent conductive oxide formed on top and bottom portions of the semitransparent metal and protecting the semitransparent metal. The semitransparent metal may include silver (Ag) or a silver alloy. The transparent conductive oxide may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). A first insulating film 103 is formed on the electrode connection wiring 11. A repair connection wiring 13 is formed on the first insulating film 103.

The repair connection wiring 13 may be formed on the same layer and of the same material as a conductive electrode included in the TFT of the pixel circuit PC, for example, a gate electrode. A second insulating layer 104 is formed on the repair connection wiring 13. In a first connection unit CU1, a first contact metal CM1 and a second contact metal CM2 formed on the second insulating layer 104 are coupled to the electrode connection wiring 11 through contact holes. A circuit connection wiring 12, that is coupled to a circuit wiring 15 coupled to the pixel circuit PC, is coupled to the electrode connection wiring 11 through a contact hole, in a second connection unit CU2. The circuit wiring 15, along with the active layer included in the TFT of the pixel circuit PC, may be formed of amorphous silicon, crystalline silicon, or an oxide semiconductor or may be formed on the same layer and of the same material as a source electrode and a drain electrode that are included in the TFT. The circuit connection wiring 12 is coupled to the electrode connection wiring 11 between the first connection units CU1 so that a first cut node CN1 and a second cut node CN2 are formed in the electrode connection wiring 11. A short wiring 14 extending from the first contact metal CM1 overlaps with a part of the repair connection wiring 13 in a first short node SN1 and is provisionally coupled to the repair connection wiring 13. The repair line RL is coupled to the repair connection wiring 13 through a contact hole. The repair line RL, the circuit connection wiring 12, the first and second contact metals CM1 and CM2, and the short wiring 14 may be formed on the same layer and of the same material as a conductive electrode included in the TFT of the pixel circuit PC, for example, the source electrode and the drain electrode. A third insulating layer 105 is formed on the repair line RL, the first and second contact metals CM1 and CM2, and the short wiring 14. The first anode AD1 and the second anode AD2 are formed on the third insulating layer 105.

A first protrusion unit AD1' extending from the first anode AD1 is coupled to the electrode connection wiring 11 through the first contact meal CM1 in the first connection unit CU1. A second protrusion unit AD2' extending from the second anode AD2 is coupled to the electrode connection wiring 11 through the second contact meal CM2 in the first connection unit CU1. Accordingly, the first anode AD1 and the second anode AD2 are electrically coupled to each other by the electrode connection wiring 11. A fourth insulating layer 106 that covers edges of the first anode AD1 and the second anode AD2 is formed on the first anode AD1 and the second anode AD2.

Figure 17:
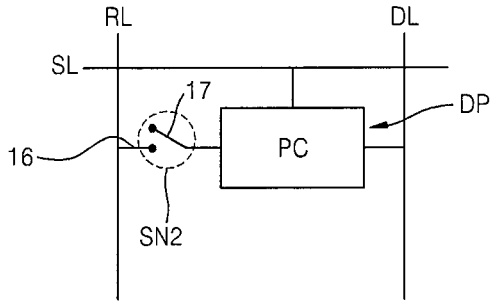
FIG. 17 is a schematic diagram of a dummy pixel according to an embodiment of the present invention.
Figure 18:
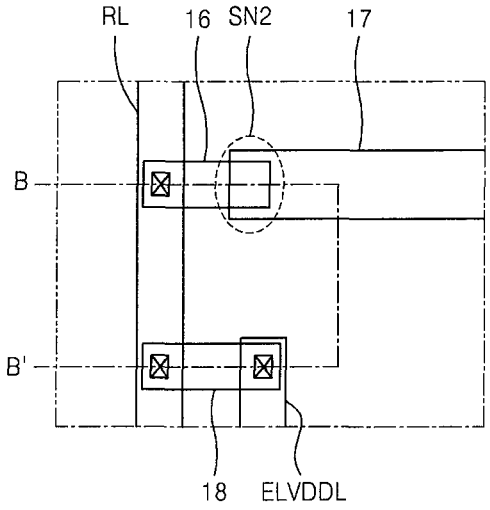
FIG. 18 is a plan view of a part of the dummy pixel of FIG. 17.
Figure 19:
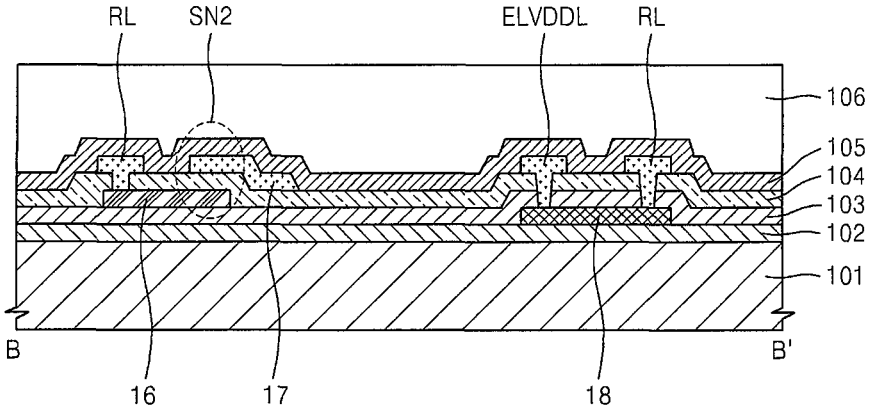
FIG. 19 is a cross-sectional view taken along the line B-B' of FIG. 18.

FIG. 17 is a schematic diagram of the dummy pixel DP according to an embodiment of the present invention. FIG. 18 is a plan view of a part of the dummy pixel DP of FIG. 17. FIG. 19 is a cross-sectional view taken along a line B-B' of FIG. 18.

Referring to FIG. 17, the dummy pixel DP that is coupled to the zeroth scan line SL0 and/or the (n+1)th scan line SLn+1 and the data line DL may include only the pixel circuit PC. The pixel circuit PC of the dummy pixel DP may be the same (e.g., the same design, structure, and/or function) as the pixel circuit PC of the emission pixel EP.

Referring to FIGS. 18 and 19, a power connection wiring 18 is formed on the substrate 101 and the buffer layer 102. The power connection wiring 18 may be formed of amorphous silicon, crystalline silicon, or an oxide semiconductor. The power connection wiring 18 may be formed on the same layer and of the same material as an active layer included in the TFT of the pixel circuit PC. The first insulating layer 103 is formed on the power connection wiring 18. A repair connection wiring 16 is formed on the first insulating layer 103.

The repair connection wiring 16 may be formed on the same layer and of the same material as a conductive electrode included in a TFT of the pixel circuit PC, for example, a gate electrode. The second insulating layer 104 is formed on the repair connection wiring 16. On the second insulating layer 104, a short wiring 17 coupled to the pixel circuit PC overlaps with a part of the repair connection wiring 16 in the first short node SN2 and is provisionally coupled to the repair connection wiring 16. The repair line RL is coupled to the repair connection wiring 16 through a contact hole. The repair line RL and a power voltage line ELVDDL in a boundary of the display panel 10 are coupled to the power connection wiring 18 so that the repair line RL and the power voltage line ELVDDL are electrically coupled to each other. When the repair line RL is used to repair the emission pixel EP, the power voltage line ELVDDL is disconnected from the repair line RL by cutting the power connection wiring 18.

The repair line RL, the short wiring 17, and the power voltage line ELVDDL may be formed on the same layer and of the same material as a conductive electrode included in the TFT of the pixel circuit PC, for example, a source electrode and a drain electrode. The third insulating layer 105 and the fourth insulating layer 106 are sequentially formed on the repair line RL, the short wiring 17, and the power voltage line ELVDDL.

Figure 20:
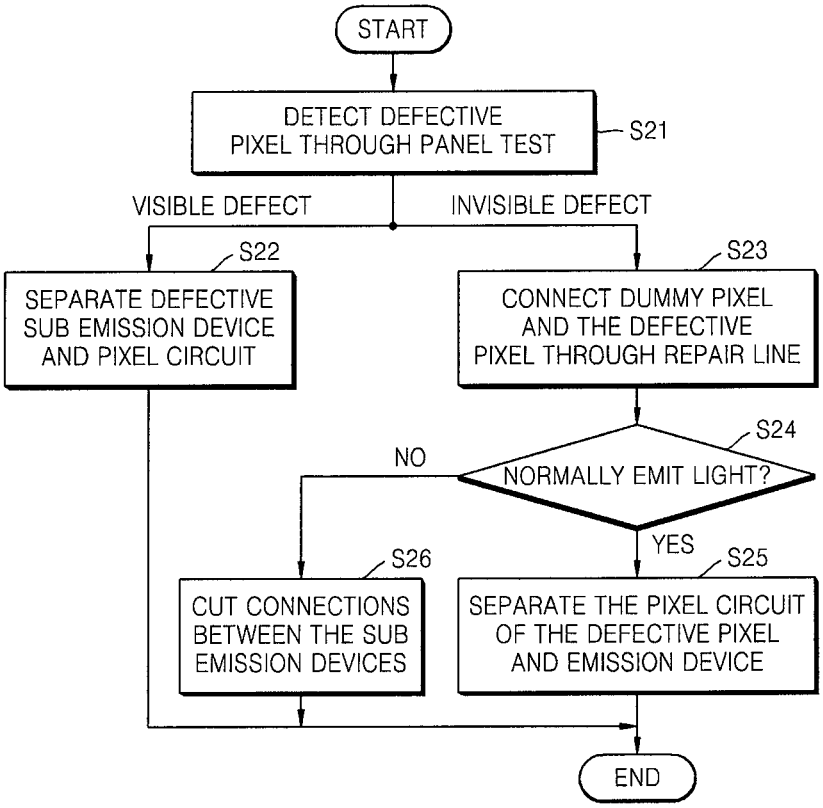
FIG. 20 is a flowchart for explaining a method of repairing a defective pixel, according to an embodiment of the present invention.

FIG. 20 is a flowchart for explaining a method of repairing a defective pixel, according to an embodiment of the present invention.

Referring to FIG. 20, after the display panel 10 is manufactured, the defective pixel of the display area AA is detected through a panel test performed on the display panel 10 (operation S21). The panel test may include, for example, a lighting test, an aging test, etc. The defective pixel is an emission pixel recognized as a bright spot or a dark spot. The bright spot or the dark spot may be generated due to a defective pixel circuit or a defective emission device. When an anode and a cathode of an emission device are shorted due to a defect present therebetween, and when a value of a resistance Rdef formed in parallel with the anode and the cathode is small, a driving current generated in the pixel circuit PC flows from the anode to the cathode through the resistance Rdef, and thus a voltage of the anode is not sufficiently higher than a turn-on voltage of the emission device, which causes the dark spot in which the emission device does not emit light.

A pixel that is visibly recognized as a bright spot or a dark spot of the display panel 10 may be detected through an optical microscope of a lighting inspection apparatus.

In a case of a visible defect in which a sub-emission device that is the bright spot or the dark spot is visibly recognized among a plurality of sub-emission devices, the sub-emission device having the defect of the bright spot or the dark spot is separated or electrically isolated from the pixel circuit PC (operation S22).

In a case of an invisible defect in which a defective sub-emission device is not visibly recognized among a plurality of sub-emission devices, an emission device of the defective pixel is coupled to the repair line RL and the pixel circuit PC of the dummy pixel DP is coupled to the repair line RL so that the defective pixel is coupled to the dummy pixel DP (operation S23). It is determined whether the defective pixel normally emits light (operation S24).

When the defective pixel normally emits light by the coupling of the defective pixel and the dummy pixel DP, the defective pixel is determined to have resulted from the defective pixel circuit. Thus, in order to completely insulate the defective pixel circuit from the emission device, the pixel circuit PC of the defective pixel may be selectively separated or electrically isolated from the emission device (operation S25). Operation S25 may be selectively performed.

When the defective pixel does not normally emit light by the coupling of the defective pixel and the dummy pixel DP, the defective pixel is determined to have resulted from the short defect of the emission device, and the sub-emission devices are disconnected from each other (operation S26).

FIGS. 21 through 26 are diagrams for explaining a method of repairing a defective pixel (operation S22) in a case of a visible defect of FIG. 20, according to embodiments of the present invention.

The repairing method of FIGS. 21 through 26 describes an example of the dummy pixel DP coupled to the (n+1)th scan line SLn+1 among the first through (n+1)th scan lines SL1 through SLn+1 like the display panel 10a of FIG. 2. This may apply to the display panels 10b and 10c of FIGS. 3 and 4.

Figure 21:
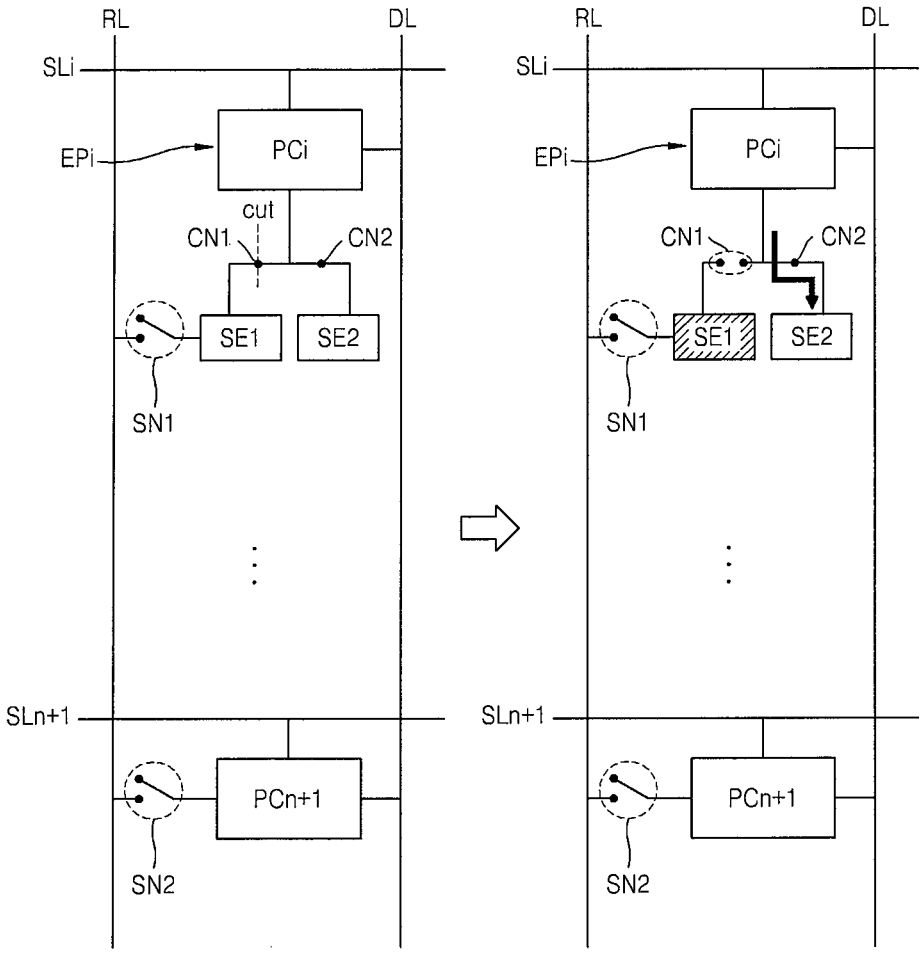
FIGS. 21 through 26 are diagrams for explaining a method of repairing a defective pixel in a case of a visible defect of FIG. 20, according to embodiments of the present invention.
Figure 22:
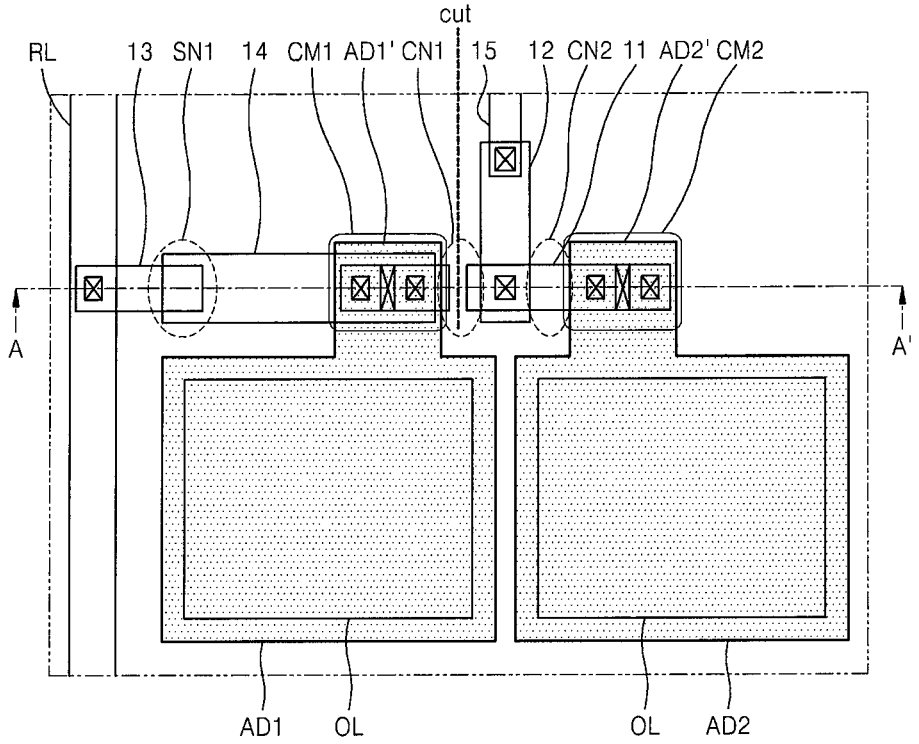
Figure 23:
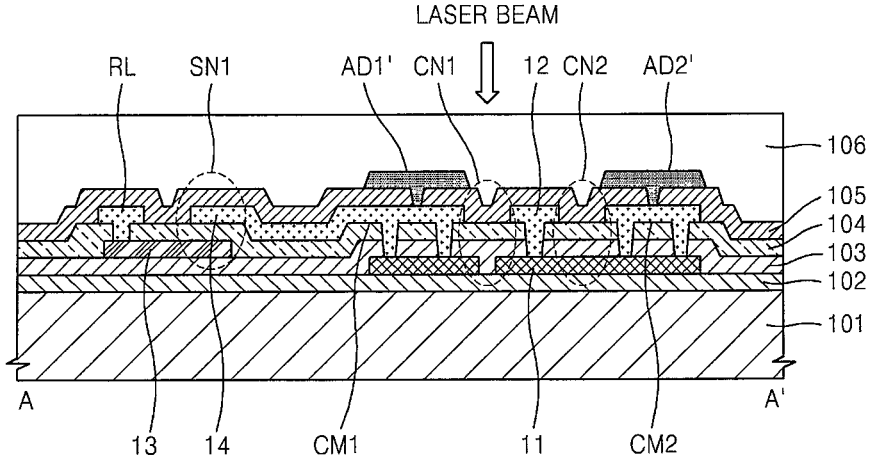

Referring to FIGS. 21 through 23, when the first sub-emission device SE1 of the defective emission pixel ER is visibly recognized to have a short defect, the first sub-emission device SE1 is disconnected from the second sub-emission device SE2. In this regard, the first cut node CN1 of the electrode connection wiring 11 is cut by irradiating a laser beam. Accordingly, the first sub-emission device SE1 becomes a dark spot and a driving current flows from an emission pixel circuit PCi to the second sub-emission device SE2 so that the second sub-emission device SE2 may emit light without any perceivable brightness reduction.

Figure 24:
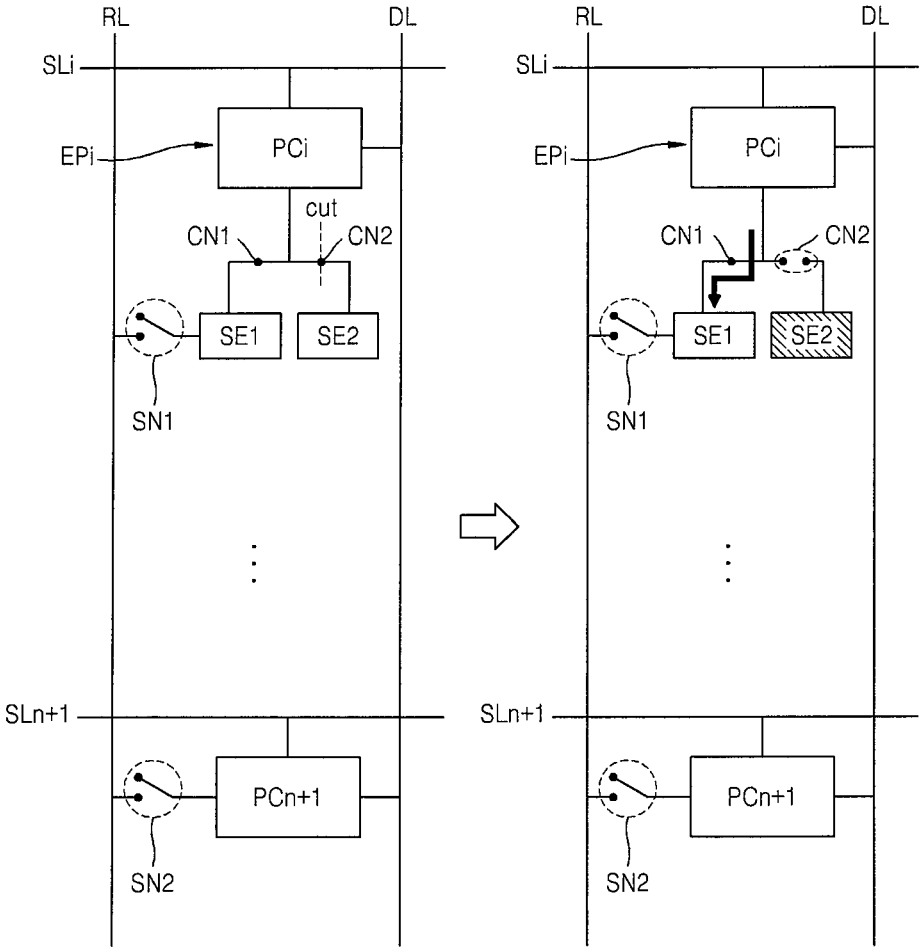
Figure 25:
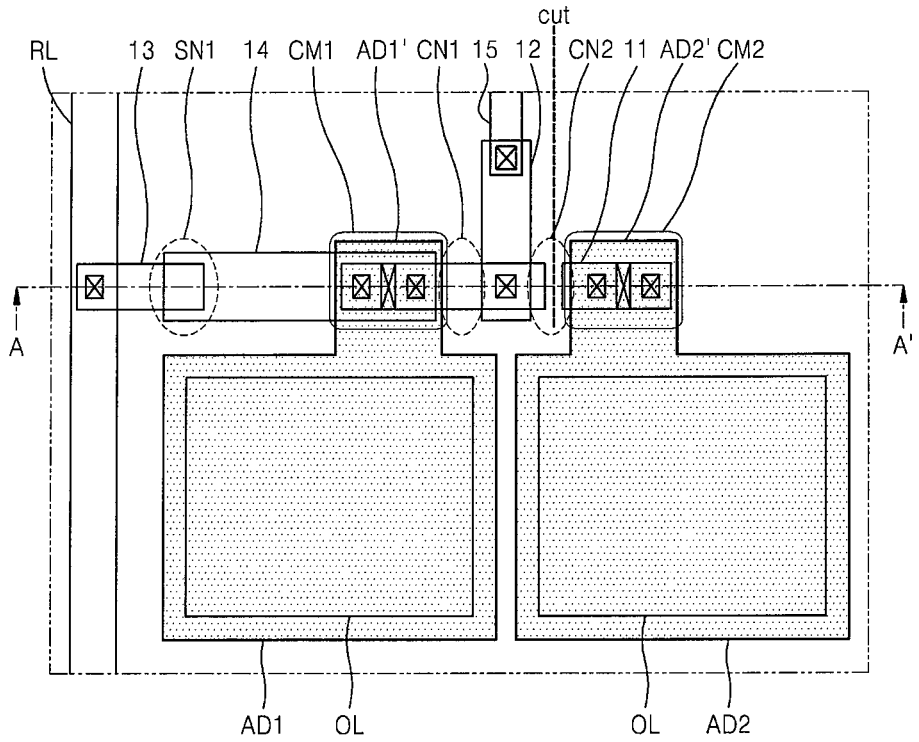
Figure 26:
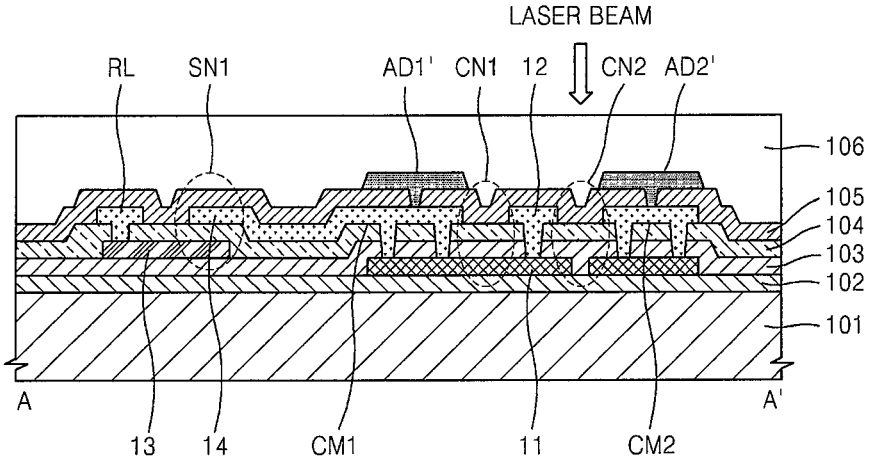
Figure 27:
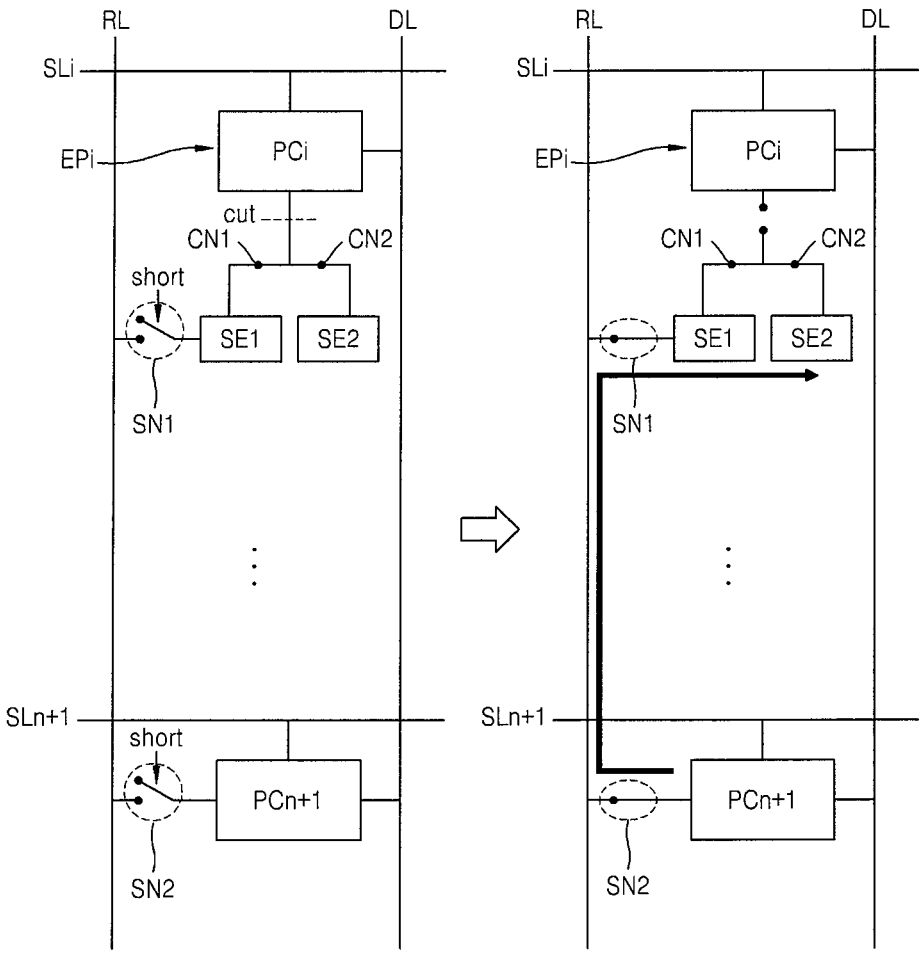
FIGS. 27 through 29B are diagrams for explaining a method of repairing a defective pixel in the case of the invisible defect of FIG. 20, according to embodiments of the present invention.
Figure 28A:
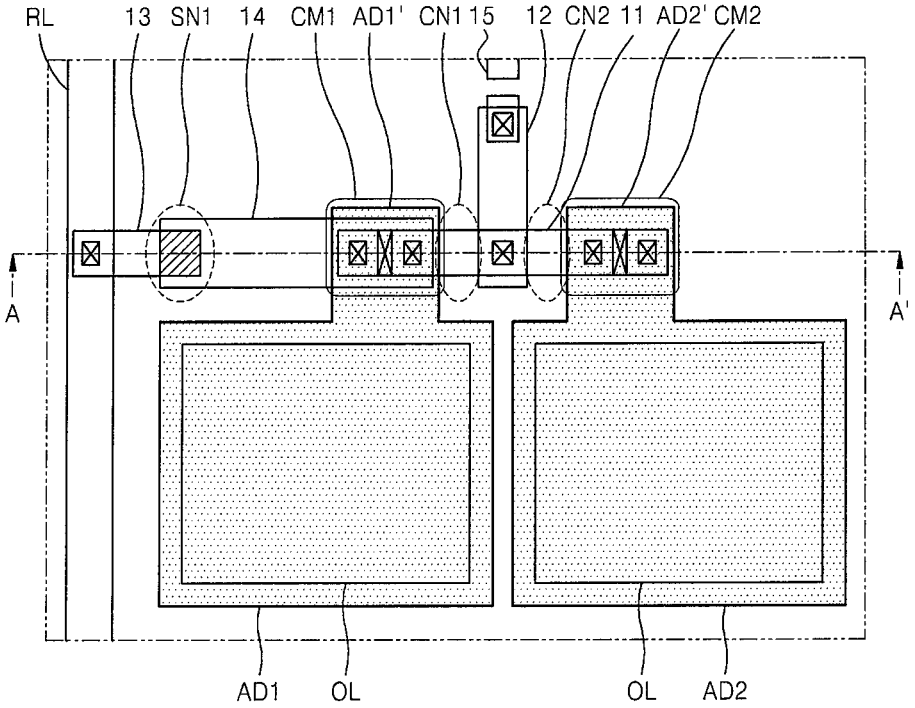
Figure 28B:
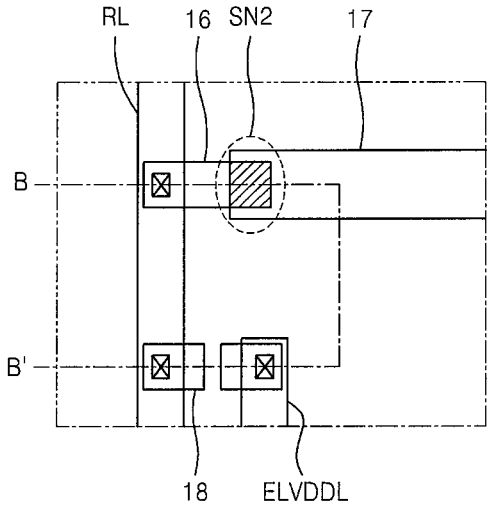
Figure 29A:
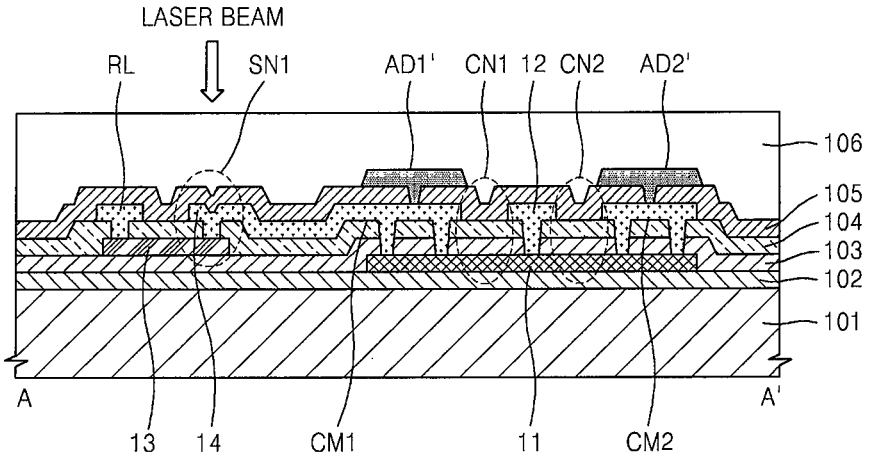
Figure 29B:
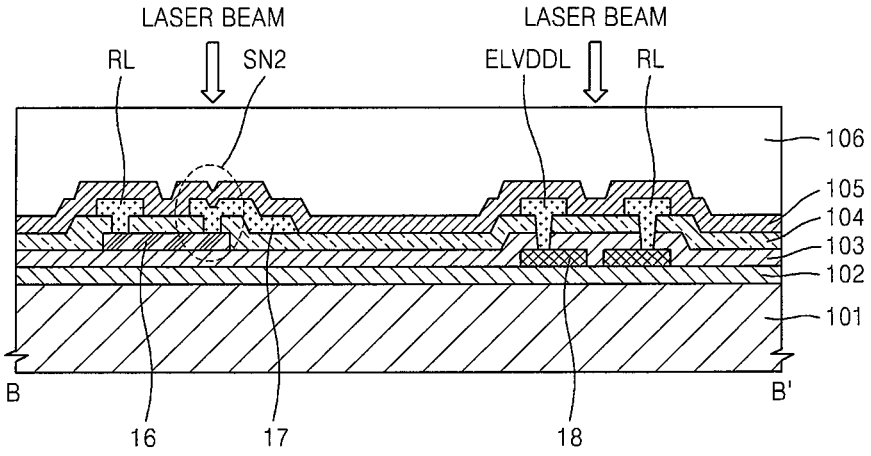

Referring to FIGS. 24 through 26, when the second sub-emission device SE2 of the defective emission pixel EPi is visibly recognized to have a short defect, the second sub-emission device SE2 is disconnected from the first sub-emission device SE1. In this regard, the second cut node CN2 of the electrode connection wiring 11 is cut by irradiating the laser beam. Accordingly, the second sub-emission device SE2 becomes the dark spot, and the driving current flows from the emission pixel circuit PCi to the first sub-emission device SE1 so that the first sub-emission device SE1 may emit light without any perceivable brightness reduction.

In the embodiments described with reference to FIGS. 21 through 26, the emission pixel EPi has a short defect, and the emission pixel circuit PCi is normal, and thus the emission pixel EPi is not necessarily coupled to the dummy pixel DP through the repair line RL.

FIGS. 27 through 29B are diagrams for explaining a method of repairing a defective pixel (operations S23 and S25) in the case of an invisible defect of FIG. 20, according to embodiments of the present invention.

The repairing method of FIGS. 27 through 29B describes an example of the dummy pixel DP coupled to the (n+1)th scan line SLn+1 among the first through (n+1)th scan lines SL1 through SLn+1 like the display panel 10a of FIG. 2. This may apply to the display panels 10b and 10c of FIGS. 3 and 4.

Referring to FIGS. 27 through 29B, although the emission pixel EPi coupled to the ith scan line SLi is determined to be defective, when it is not determined whether the defective emission pixel EPi has resulted from a defective pixel circuit or a defective emission device, the provisionally coupled repair connection wiring 13 and the short wiring 14 are shorted by irradiating a laser beam onto the first short node SN1, and then the provisionally coupled repair connection wiring 16 and the short wiring 17 are shorted by irradiating the laser beam onto the second short node SN2, and thus the emission pixel EPi and the dummy pixel DP are electrically coupled to each other (operation S23). The power voltage line ELVDDL and the repair line RL are disconnected from each other by irradiating the laser beam onto the power connection wiring 18.

After the coupling of the repair line RL and the dummy pixel DP and defective emission pixel EPi, when the first sub-emission device SE1 and the second sub-emission device SE2 normally emit light, because the defective emission pixel EPi is determined to have resulted from the defective emission pixel circuit PCi, to completely insulate the defective emission pixel circuit PCi from the defective emission pixel EPi, the circuit connection wiring 12 and the circuit wiring 15 are separated or electrically isolated from each other by cutting the circuit wiring 15 by irradiating the laser beam onto the circuit wiring 15, and thus the emission pixel circuit PCi is separated or electrically isolated from the emission pixel EPi (operation S25).

Accordingly, a driving current flows from a dummy pixel circuit PCn+1 to the first sub-emission device SE1 and the second sub-emission device SE so that the emission pixel EPi may emit light without any perceivable brightness reduction.

FIGS. 30A through 32 are diagrams for explaining a method of repairing a defective pixel (operations S23 and S26) in the case of the invisible defect of FIG. 20, according to embodiments of the present invention.

The repairing method of FIGS. 30A through 32 describes an example of the dummy pixel DP coupled to the (n+1)th scan line SLn+1 among the first through (n+1)th scan lines SL1 through SLn+1 like the display panel 10a of FIG. 2. This may apply to the display panels 10b and 10c of FIGS. 3 and 4.

Referring to FIGS. 28B and 30A through 32, although the emission pixel EPi coupled to the ith scan line SL1 is determined to be defective, when it is not determined whether the defective emission pixel EPI has resulted from a defective pixel circuit or a defective emission device, the provisionally coupled repair connection wiring 13 and the short wiring 14 are shorted by irradiating a laser beam onto the first short node SN1, and the provisionally coupled repair connection wiring 16 and the short wiring 17 are shorted by irradiating the laser beam onto the second short node SN2, and thus the emission pixel EPi and the dummy pixel DP are electrically coupled to each other (operation S23). The power voltage line ELVDDL and the repair line RL are disconnected from each other by irradiating the laser beam onto the power connection wiring 18.

After the coupling of the repair line RL, the dummy pixel DP, and the emission pixel EPi, when the first sub-emission device SE1 and the second sub-emission device SE2 do not normally emit light, because the defective emission pixel EPi is determined to have resulted from the defective emission device E, the first cut node CN1 of the electrode connection wiring 11 is cut by irradiating the laser beam onto the electrode connection wiring 11 (operation S26). Thus, the first sub-emission device SE1 and the second sub-emission device SE2 are separated or electrically isolated from each other, the first sub-emission device SE1 receives a driving current from the dummy pixel circuit PCn+1, and the second sub-emission device SE2 receives a driving current from the emission pixel circuit PCi.

Figure 30A:
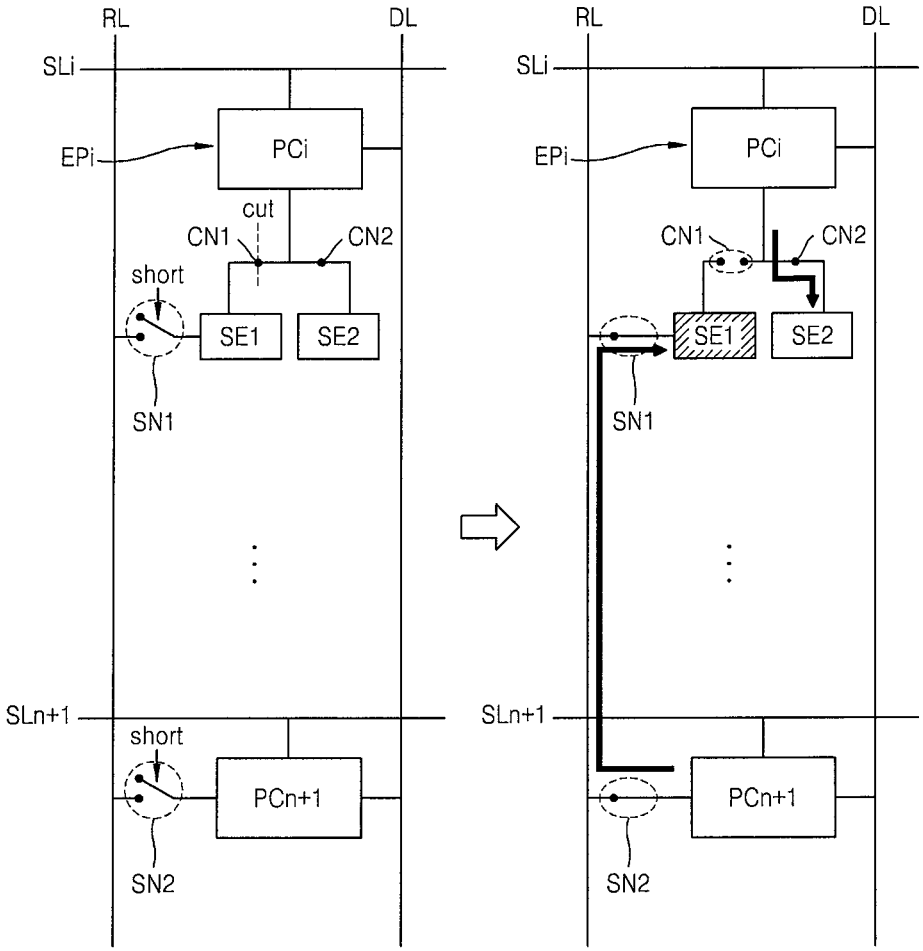
FIGS. 30A through 32 are diagrams for explaining a method of repairing a defective pixel in the case of the invisible defect of FIG. 20, according to embodiments of the present invention.

If the defective emission pixel EPi is determined to have resulted from a short defect of the first sub-emission device SE1, as shown in FIG. 30A, the first sub-emission device SE1 becomes a dark spot, and the second sub-emission device SE2 may emit light by the driving current from the emission pixel circuit PCi without any perceivable brightness reduction.

Figure 30B:
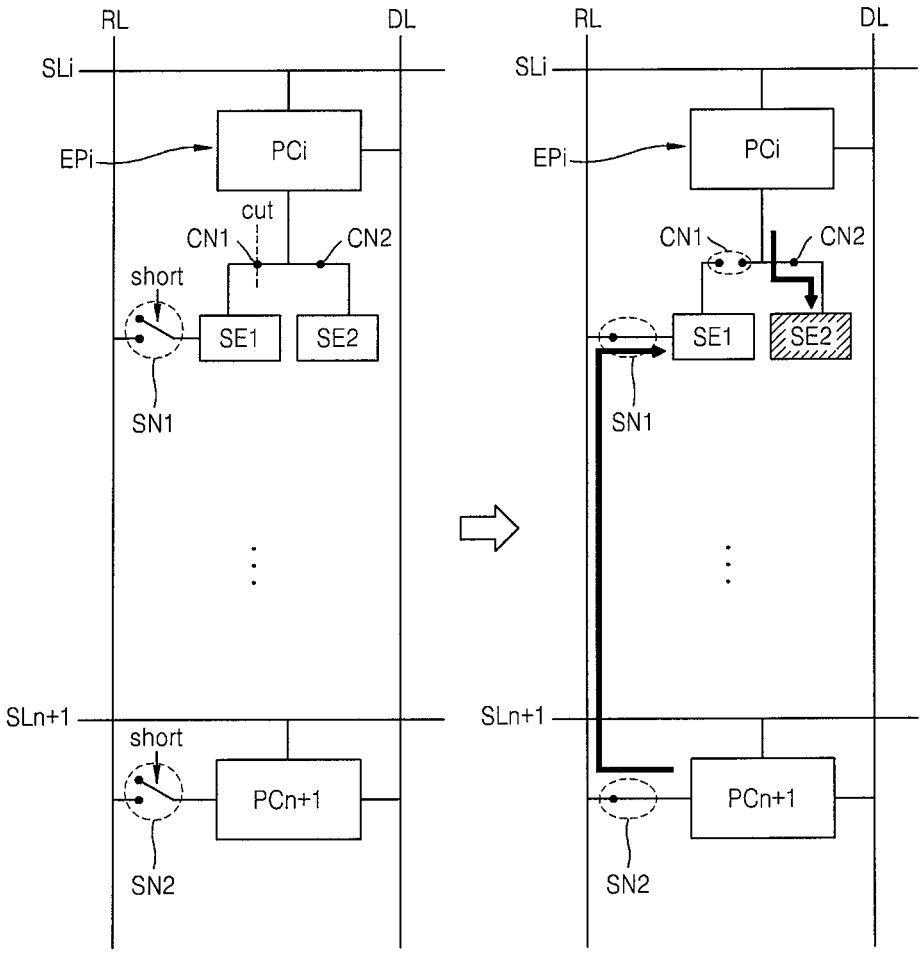
Figure 31:
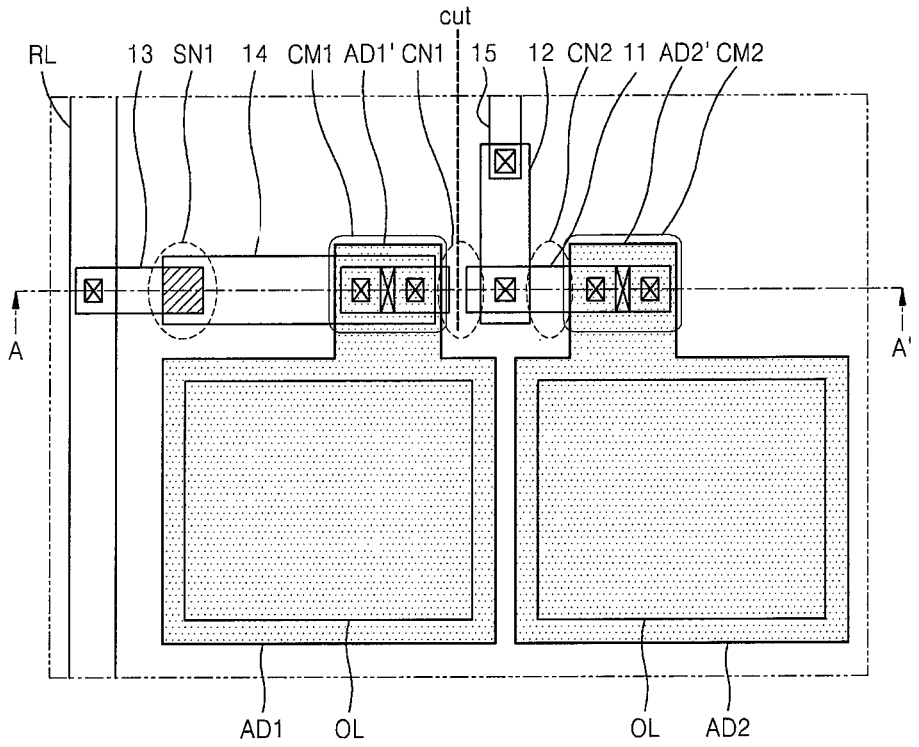
Figure 32:
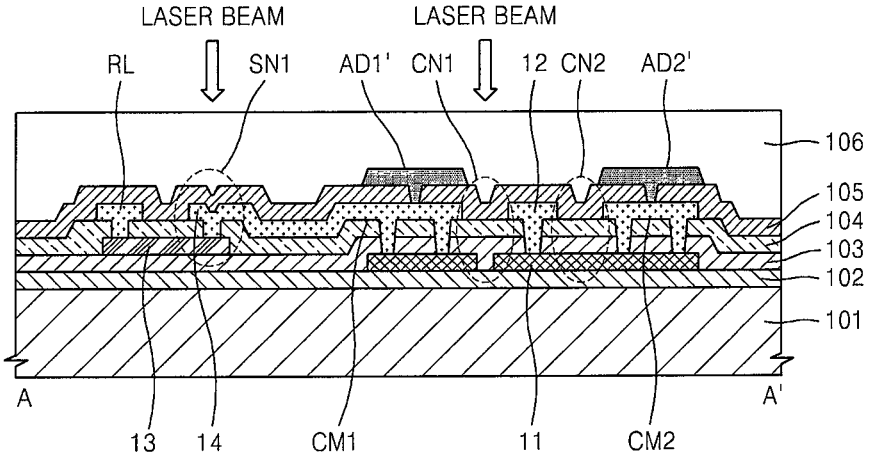

If the defective emission pixel EPi is determined to have resulted from a short defect of the second sub-emission device SE2, as shown in FIG. 30B, the second sub-emission device SE2 becomes the dark spot, and the first sub-emission device SE1 may emit light by the driving current from the dummy pixel circuit PCn+1 without any perceivable brightness reduction.

Figure 33:
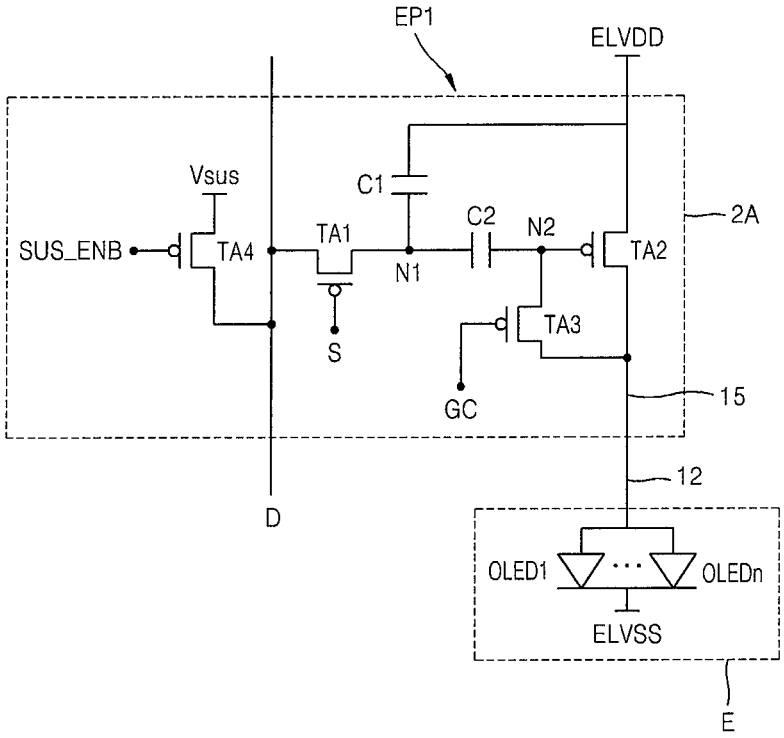
FIGS. 33 through 36 are circuit diagrams of an emission pixel according to embodiments of the present invention.

FIG. 33 is a circuit diagram of an emission pixel EP1 according to an embodiment of the present invention.

Referring to FIG. 33, the emission pixel EP1 includes the emission device E and a pixel circuit 2A for supplying a current to the emission device E. The dummy pixel DP includes the pixel circuit 2A excluding the emission device E. The emission device E includes an anode, a cathode, and an emission layer formed or located between the anode and the cathode, and may be an OLED having a structure in which the anode is split or separated into a plurality of anodes. The emission device E may include first through nth OLEDs OLED1 through OLEDn that are coupled in parallel to each other by the plurality of anodes resulting from the splitting of the anode. Accordingly, a driving current of the pixel circuit 2A is separately provided to the first through nth OLEDs OLED1 through OLEDn. If a defective OLED is separated or electrically isolated from the corresponding pixel circuit, because the driving current is separately provided to the other OLEDs, the OLEDs may emit light without any perceivable brightness loss. The circuit connection wiring 12 coupled to the emission device E is disconnected from the circuit wiring 15 coupled to the pixel circuit 2A by cutting the circuit wiring 15, and thus the pixel circuit 2A and the emission device E may be separated or electrically isolated from each other.

The pixel circuit 2A may include first through fourth transistors TA1 through TA4, and first and second capacitors C1 and C2.

A gate electrode of the first transistor TA1 receives a scan signal S from a scan line. A first electrode of the first transistor TA1 receives a data signal D from a data line. A second electrode of the first transistor TA1 is coupled to a first node N1.

A gate electrode of the second transistor TA2 is coupled to a second node N2. A first electrode of the second transistor TA2 receives a first power voltage ELVDD from a first power source. A second electrode of the second transistor TA2 is coupled to the anode of the OLED. The second transistor TA2 functions as a driving transistor.

The first capacitor C1 is coupled between the first node N1, and the second electrode of the second transistor TA2 and the first power source. The second capacitor C2 is coupled between the first node N1 and the second node N2.

A gate electrode of the third transistor TA3 receives a first control signal GC. A first electrode of the third transistor TA3 is coupled to the gate electrode of the second transistor TA2. A second electrode of the third transistor TA3 is coupled to the anode of the OLED and the second electrode of the second transistor TA2.

A gate electrode of the fourth transistor TA4 receives a second control signal SUS_ENB. A first electrode of the fourth transistor TA4 receives an auxiliary voltage Vsus. A second electrode of the fourth transistor TA4 is coupled to the data line and receives the data signal D.

In an initialization period, the scan signal S having a low level is provided to the scan line, and a second control signal SUS_ENB having a low level is provided to the gate electrode of the fourth transistor TA4. In this case, the data line is in a high impedance (Hi-Z) state. As such, the first transistor TA1 and the fourth transistor TA4 are turned on and thus the auxiliary voltage Vsus having a high level is provided to the first node N1, a voltage of the second node N2 is reduced, and the second node N2 is maintained at an initialization voltage (e.g., a predetermined initialization voltage).

In a compensation period, the auxiliary voltage Vsus having a high level is provided to the first node N1 through the data line. The first control signal GC is provided at a low level and thus the third transistor TA3 is turned on. As such, the second transistor TA2 is diode-connected and thus a current flows until a voltage corresponding to a threshold voltage of the second transistor TA2 is stored in the second capacitor C2. After that, the second transistor TA2 is turned off.

In a scan/data input period, the scan signal S having a low level is provided to the scan line and thus the first transistor TA1 is turned on, and the data signal D is provided through the data line. As such, a voltage difference between the driving voltage ELVDD and a voltage of the first node N1 is stored in the first capacitor C1.

In an emission period, the first power voltage ELVDD is provided at a high level, and the second power voltage ELVSS is provided at a low level. A current path from the first power voltage ELVDD to the cathode of the OLED is formed via the second transistor TA2, and the emission devices E of all the emission pixels EP1 emit light at a brightness corresponding to the data signal.

Figure 34:
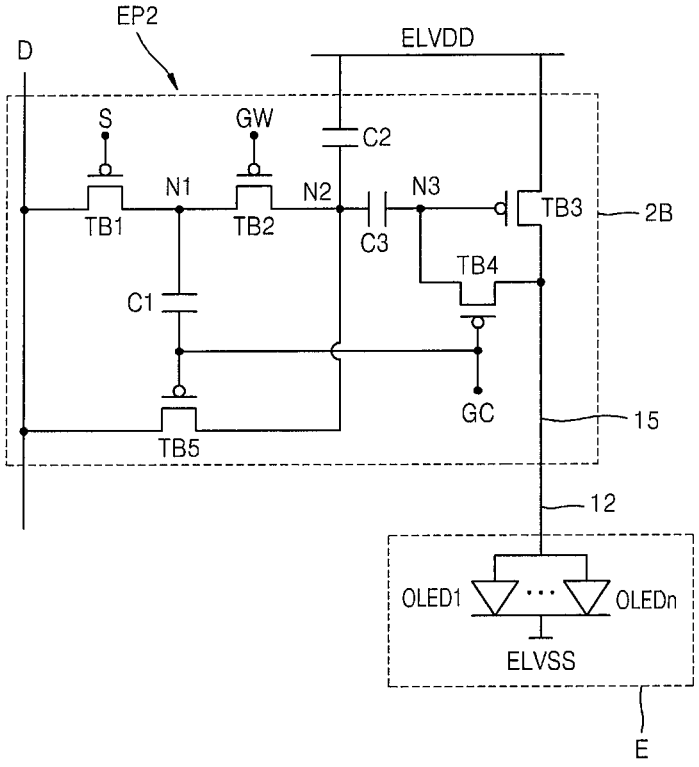

FIG. 34 is a circuit diagram of an emission pixel EP2 according to another embodiment of the present invention.

Referring to FIG. 34, the emission pixel EP2 includes the emission device E and a pixel circuit 2B for supplying a current to the emission device E. The dummy pixel DP includes the pixel circuit 2B excluding the emission device E. The emission device E includes an anode, a cathode, and an emission layer formed or located between the anode and the cathode, and may be an OLED having a structure in which the anode is split or physically separated into a plurality of anodes having a gap or space between the separated anodes. The emission device E may include the first through nth OLEDs OLED1 through OLEDn that are coupled in parallel to each other through the plurality of anodes resulting from the splitting of the anode. Accordingly, a driving current of the pixel circuit 2B is separately provided to the first through nth OLEDs OLED1 through OLEDn. If a defective OLED is separated or electrically isolated, because the driving current is separately provided to the other OLEDs, the OLEDs may emit light without any perceivable brightness loss. The circuit connection wiring 12 coupled to the emission device E is disconnected from the circuit wiring 15 coupled to the pixel circuit 2B by cutting the circuit wiring 15, and thus the pixel circuit 2B and the emission device E may be separated or electrically isolated from each other.

The pixel circuit 2B includes first through fifth transistors TB1 through TB5, and first through third capacitors C1 through C3.

A gate electrode of the first transistor TB1 receives the scan signal S from a scan line. A first electrode of the first transistor TB1 is coupled to a data line and receives the data signal D from the data line. A second electrode of the first transistor TB1 is coupled to the first node N1.

A gate electrode of the second transistor TB2 receives a first control signal GW. A first electrode of the second transistor TB2 is coupled to the first node N1. A second electrode of the second transistor TB2 is coupled to the second node N2.

A gate electrode of the third transistor TB3 is coupled to a third node N3. A first electrode of the third transistor TB3 receives a first power voltage ELVDD from a first power source. A second electrode of the third transistor TB3 is coupled to the anode of the OLED. The third transistor TB3 functions as a driving transistor.

A gate electrode of the fourth transistor TB4 receives a second control signal GC. A first electrode of the fourth transistor TB4 is coupled to the third node N3 and the gate electrode of the third transistor TB3. A second electrode of the fourth transistor TB4 is coupled to the anode of the OLED.

A gate electrode of the fifth transistor TB5 receives the second control signal GC. A first electrode of the fifth transistor TB5 is coupled to the data line and receives the data signal D from the data line. A second electrode of the fifth transistor TB5 is coupled to the second node N2.

The first capacitor C1 is coupled between the first node N1 and the gate electrode of the fifth transistor TB5. The second capacitor C2 is coupled between the second node N2 and the first power source providing the first power voltage ELVDD. The third capacitor C3 is coupled between the second node N2, and the third node N3, and the gate electrode of the third transistor TB3. When the first transistor TB1 is turned on, the first capacitor C1 is charged with a voltage corresponding to the data signal D provided from the data line.

In an initialization period, the first power voltage ELVDD and the second control signal GC are provided at a low level. The data line is in a high impedance (Hi-Z) state. As such, the fifth transistor TB5 and the fourth transistor TB4 are sequentially turned on and thus the third transistor TB3 is diode-connected, and a voltage of the anode of the OLED and a voltage of the third node N3 are initialized to a level of the driving voltage ELVDD.

In a compensation period, the second control signal GC is provided at a low level, and an auxiliary voltage Vsus having a high level is provided to the data line. As such, the fifth transistor TB5 is turned on and thus the auxiliary voltage Vsus is provided to the second node N2. Also, the fourth transistor TB4 is turned on and thus the third transistor TB3 is diode-connected, and a current flows until a voltage corresponding to a threshold voltage of the third transistor TB3 is stored in the third capacitor C3. Thereafter, the third transistor TB3 is turned off.

In a data transmission period, the first power voltage ELVDD and the second power voltage ELVSS are provided at a high level, and the first control signal GW is provided at a low level. As such, the second transistor TB2 is turned on and thus the data signal D written in the emission pixel EP2 in a scan period of an (N−1)th frame stored in the first capacitor C1 moves to the second node N2. Accordingly, a voltage difference between the driving voltage ELVDD and a voltage of the second node N2 is stored in the second capacitor C2.

In a scan/emission period Scan/Emission, a scan period and an emission period are concurrently (e.g., simultaneously) performed. In the scan/emission period Scan/Emission, the first power voltage ELVDD is provided at a high level, and the second power voltage ELVSS is provided at a low level. Also, the scan signal S at a low level is input to the scan line and thus the first transistor TB1 is turned on, and a data signal is input to the emission pixel EP2 coupled to the scan line. As such, a voltage corresponding to a data signal of an Nth frame is stored in the first capacitor C1.

The second transistor TB2 is turned off to block the first node N1 and the second node N2. Also, a current path from the first power voltage ELVDD to the cathode of the OLED is formed via the turned-on third transistor TB3, and the OLED emits light to a brightness corresponding to the data signal written in the emission pixel EP2 in the scan period of the (N−1)th frame stored in the second capacitor C2. In this regard, all emission pixels EP2 in the display area AA concurrently (e.g., simultaneously) emit light. That is, in the scan/emission period Scan/Emission, data signals of the Nth frame are sequentially input according to scan signals and, at the same time, all emission pixels EP2 in the display area AA concurrently (e.g., simultaneously) emit light in correspondence with data signals of the (N−1)th frame.

Figure 35:
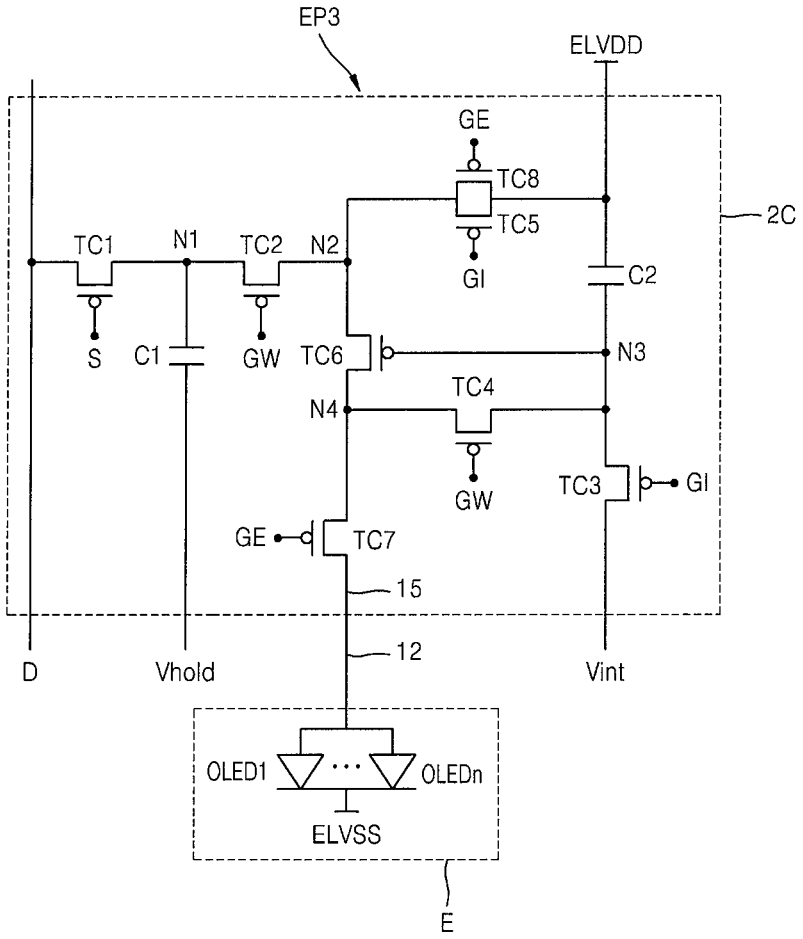

FIG. 35 is a circuit diagram of an emission pixel EP3 according to another embodiment of the present invention.

Referring to FIG. 35, the emission pixel EP3 includes the emission device E and a pixel circuit 2C for supplying a current to the emission device E. The dummy pixel DP includes the pixel circuit 2C excluding the emission device E. The emission device E includes an anode, a cathode, and an emission layer formed or located between the anode and the cathode, and may be an OLED having a structure in which the anode is split into a plurality of anodes. The emission device E may include the first through nth OLEDs OLED1 through OLEDn that are coupled in parallel to each other according to the plurality of anodes resulting from the splitting of the anode. Accordingly, a driving current of the pixel circuit 2B is separately provided to the first through nth OLEDs OLED1 through OLEDn. If a defective OLED is separated or electrically isolated from the corresponding pixel circuit, because the driving current is separately provided to the other OLEDs, the OLEDs may emit light without any perceivable brightness loss. The circuit connection wiring 12 coupled to the emission device E is disconnected from the circuit wiring 15 coupled to the pixel circuit 2C by cutting the circuit wiring 15, and thus the pixel circuit 2C and the emission device E may be separated or electrically isolated from each other.

The pixel circuit 2C includes first through eighth transistors TC1 through TC8, and the first and second capacitors C1 and C2.

A gate electrode of the first transistor TC1 receives the scan signal S from a scan line. A first electrode of the first transistor TC1 is coupled to a data line and receives a data signal D from the data line. A second electrode of the first transistor TC1 is coupled to the first node N1.

A gate electrode of the second transistor TC2 receives the first control signal GW. A first electrode of the second transistor TC2 is coupled to the first node N1. A second electrode of the second transistor TC2 is coupled to the second node N2.

A gate electrode of the third transistor TC3 receives a second control signal GI. A first electrode of the third transistor TC3 is coupled to an initialization power source and receives an initialization voltage Vint from the initialization power source. A second electrode of the third transistor TC3 is coupled to the third node N3.

A gate electrode of the fourth transistor TC4 receives the first control signal GW. A first electrode of the fourth transistor TC4 is coupled to the third node N3. A second electrode of the fourth transistor TC4 is coupled to a fourth node N4.

A gate electrode of the fifth transistor TC5 receives the second control signal GI. A first electrode of the fifth transistor TC5 is coupled to a first power source and receives the first power voltage ELVDD from the first power source. A second electrode of the fifth transistor TC5 is coupled to the second node N2.

A gate electrode of the sixth transistor TC6 is coupled to the third node N3. A first electrode of the sixth transistor TC6 is coupled to the second node N2. A second electrode of the sixth transistor TC6 is coupled to the fourth node N4. The sixth transistor TC6 functions as a driving transistor.

A gate electrode of the seventh transistor TC7 receives a third control signal GE. A first electrode of the seventh transistor TC7 is coupled to the fourth node N4. A second electrode of the seventh transistor TC7 is coupled to the anode of the OLED.

A gate electrode of the eighth transistor TC8 receives the third control signal GE. A first electrode of the eighth transistor TC8 is coupled to the first power source and receives the first power voltage ELVDD from the first power source. A second electrode of the eighth transistor TC8 is coupled to the second node N2.

The first capacitor C1 is coupled between the first node N1 and a third power source for providing a third power voltage Vhold. When the first transistor TC1 is turned on, the first capacitor C1 is charged with a voltage corresponding to the data signal D provided from the data line. The third power source may be set as a power source fixed to a voltage (e.g., a predetermined voltage, for example, a direct current (DC) power source). For example, the third power source may be set as the first power source for providing the first power voltage ELVDD or the initialization power source for providing the initialization voltage Vint. The second capacitor C2 is coupled between the third node N3 and the first power source.

In an initialization period, the first power voltage ELVDD is provided at a high level, and the second power voltage ELVSS and the second control signal GI are provided at a low level. As such, the third transistor TC3 and the fifth transistor TC5 are turned on, and thus the first power voltage ELVDD is provided to the second node N2 and the initialization voltage Vint is provided to the third node N3.

In a compensation/data transmission period, the first power voltage ELVDD, the second power voltage ELVSS, and the first control signal GW are provided at a low level. As such, the second transistor TC2 is turned on, and thus the data signal D, written in the emission pixel EP3 in a scan period of an (N−1)th frame stored in the first capacitor C1, moves to the second node N2. Also, the fourth transistor TC4 is turned on and thus the sixth transistor TC6 is diode-connected, and a current flows through the diode-connected sixth transistor TC6, and thus a threshold voltage of the sixth transistor TC6 is compensated, and a voltage difference between the driving voltage ELVDD and a voltage of the second node N2 is stored in the second capacitor C2.

In a scan/emission period, a scan period and an emission period are concurrently (e.g., simultaneously) performed. In the scan/emission period, the first power voltage ELVDD is provided at a high level, and the second power voltage ELVSS and the third control signal GE are provided at a low level. Also, the scan signal S having a low level is input to the scan line and thus the first transistor TC1 is turned on, and a data signal of an Nth frame is input to the emission pixels EP3 coupled to the scan line. As such, a voltage corresponding to the data signal of the Nth frame is stored in the first capacitor C1.

The second transistor TC2 is turned off to block the first node N1 and the second node N2. Also, the seventh and eighth transistors TC7 and TC8 are turned on and thus a current path from the first power voltage ELVDD to the cathode of the OLED is formed via the turned-on sixth transistor TC6, and the OLED emits light at a brightness corresponding to a data signal written in the emission pixel EP3 in the scan period of the (N−1)th frame stored in the second capacitor C2. In this regard, all emission pixels EP3 in the display area AA concurrently (e.g., simultaneously) emit light. That is, in the scan/emission period, data signals of the Nth frame are sequentially input according to scan signals and, at the same time, all emission pixels EP3 in the display area AA concurrently (e.g., simultaneously) emit light in correspondence with data signals of the (N−1)th frame. The emission period may partially overlap with the scan period and may be shorter than the scan period.

Figure 36:
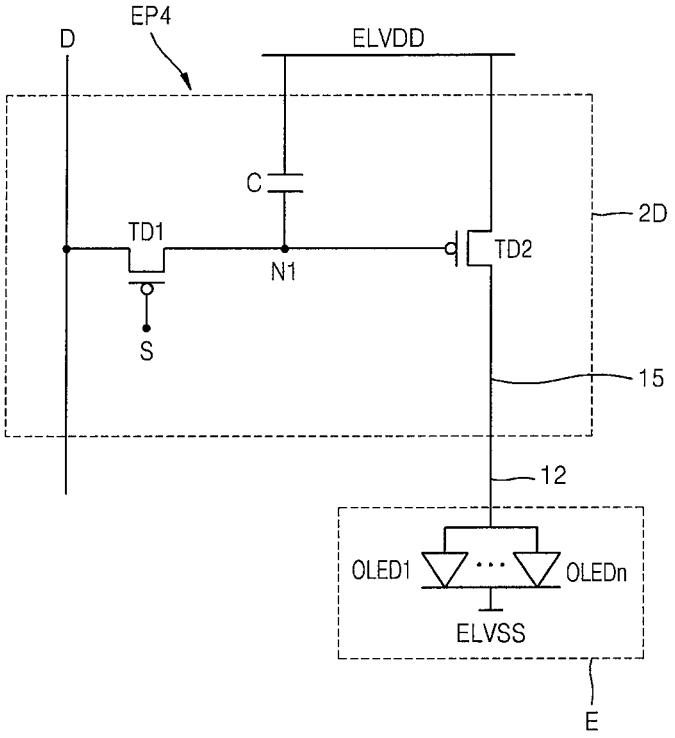

FIG. 36 is a circuit diagram of an emission pixel EP4 according to another embodiment of the present invention.

Referring to FIG. 36, the emission pixel EP4 includes the emission device E and a pixel circuit 2D for supplying a current to the emission device E. The dummy pixel DP includes the pixel circuit 2D excluding the emission device E. The emission device E includes an anode, a cathode, and an emission layer formed or located between the anode and the cathode, and may be an OLED having a structure in which the anode is split into a plurality of anodes. The emission device E may include the first through nth OLEDs OLED1 through OLEDn that are coupled in parallel to each other according to the plurality of anodes resulting from the splitting of the anode. Accordingly, a driving current of the pixel circuit 2D is separately provided to the first through nth OLEDs OLED1 through OLEDn. If a defective OLED is separated or electrically isolated, because the driving current is separately provided to the other OLEDs, the OLEDs may emit light without any perceivable brightness loss. The circuit connection wiring 12 coupled to the emission device E is disconnected from the circuit wiring 15 coupled to the pixel circuit 2D by cutting the circuit wiring 15, and thus the pixel circuit 2D and the emission device E may be separated or electrically isolated from each other.

The pixel circuit 2D includes first and second transistors TD1 and TD2, and a first capacitor C.

A gate electrode of the first transistor TD1 is coupled to a scan line. A first electrode of the first transistor TD1 is coupled to a data line. A second electrode of the first transistor TD1 is coupled to the first node N1.

A gate electrode of the second transistor TD2 is coupled to the first node N1. A first electrode of the second transistor TD2 receives the first power voltage ELVDD from a first power source. A second electrode of the second transistor TD2 is coupled to the anode of the OLED.

A first electrode of the capacitor C is coupled between the first node N1. A second electrode of the capacitor C receives (e.g., is coupled to) the first power voltage ELVDD from the first power source.

When the scan signal S is provided from the scan line, the first transistor TD1 transfers the data signal D provided from the data line to the first electrode of the capacitor C. As such, a voltage corresponding to the data signal D is charged in the capacitor C, and a driving current corresponding to the voltage charged in the capacitor C is transferred to the emission device E through the second transistor TD2, and thus the emission device E emits light.

Although the emission pixel EP4 of FIG. 36 has a 2Tr-1Cap structure including two transistors and one capacitor in one pixel, the present invention is not limited thereto. That is, the emission pixel EP4 may have various structures including two or more transistors and one or more capacitors by forming additional wirings or omitting the existing wirings.

Figure 37:
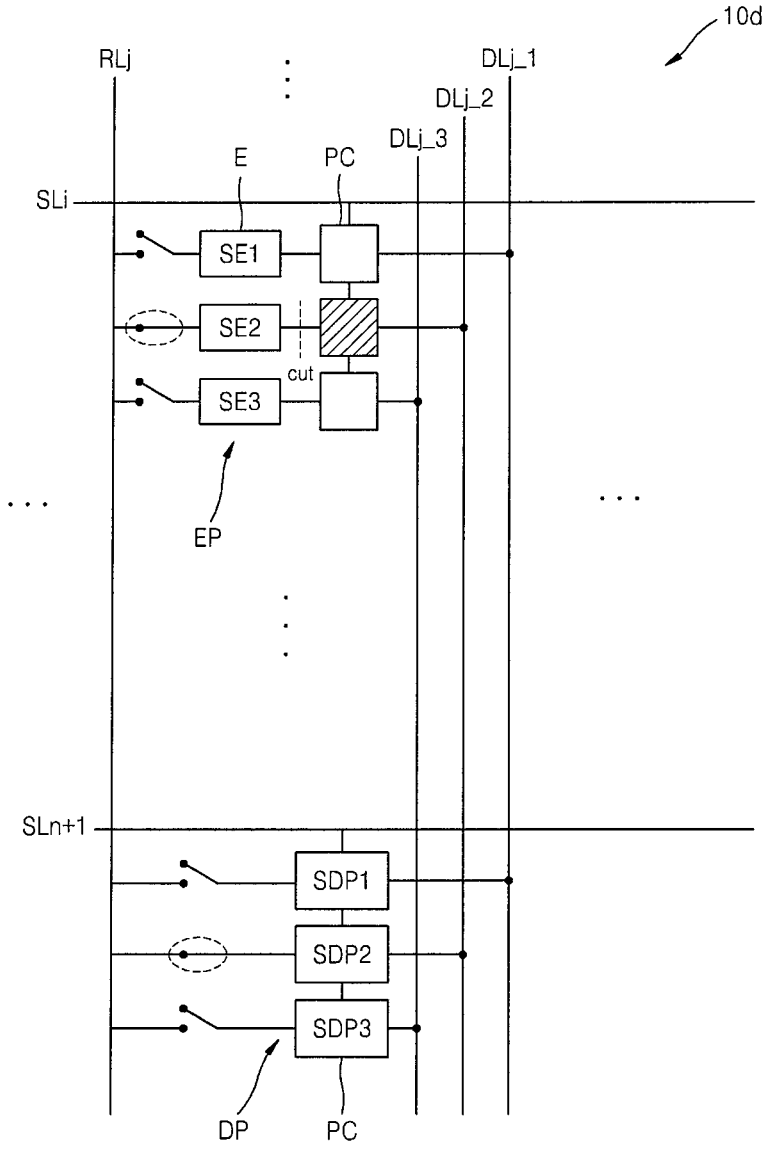
FIG. 37 is a schematic diagram of a display panel, according to another embodiment of the present invention.

FIG. 37 is a schematic diagram of a display panel 10d according to another embodiment of the present invention.

Referring to FIG. 37, a plurality of pixels P aligned in a matrix-like shape where the plurality of scan lines SL, the plurality of data lines DL, and the plurality of repair lines RL cross each other are formed on the display panel 10d. The pixels P include emission pixels EP formed on the display area AA, and dummy pixels DP formed on the non-display area NA. The non-display area NA may be formed on at least one of top and bottom regions of the display area AA. As such, one or more dummy pixels DP may be formed in each pixel column on at least one of top and bottom regions of the pixel column. FIG. 37 shows an example that the dummy pixel DP is formed on the bottom region of the pixel column.

One emission pixel EP includes first through third sub-emission pixels SEP1, SEP2, and SEP3 aligned in a column direction. Each of the first through third sub-emission pixels SEP1, SEP2, and SEP3 includes the pixel circuit PC, and the emission device E coupled to the pixel circuit PC. The emission device E may be an OLED including an anode, a cathode, and an emission layer between the anode and the cathode. The anode of the emission device E may be split into at least two anodes and thus the emission device E may include at least two sub-emission devices.

The pixel circuits PC and/or the emission devices E of the first through third sub-emission pixels SEP1, SEP2, and SEP3 may differ in size. The first through third sub-emission pixels SEP1, SEP2, and SEP3 are commonly coupled to one scan line, for example, an ith scan line SLi, and are respectively coupled to first through third data lines DLj_1, DLj_2, and DLj_3. Accordingly, if a scan signal is provided to the ith scan line SLi, data signals are provided via the first through third data lines DLj_1, DLj_2, and DLj_3 respectively to the first through third sub-emission pixels SEP1, SEP2, and SEP3, and thus each of the first through third sub-emission pixels SEP1, SEP2, and SEP3 is charged with a voltage corresponding to the provided data signal and emits light at a brightness corresponding to the charged voltage.

The dummy pixel DP includes first through third sub-dummy pixels SDP1, SDP2, and SDP3 aligned in a column direction. Each of the first through third sub-dummy pixels SDP1, SDP2, and SDP3 includes only a pixel circuit PC excluding an emission device E. The pixel circuit PC of each of the first through third sub dummy pixels SDP1, SDP2, and SDP3 may have the same or substantially the same design and function as the pixel circuit PC of each of the first through third sub-emission pixels SEP1, SEP2, and SEP3. The first through third sub-dummy pixels SDP1, SDP2, and SDP3 are commonly coupled to one scan line, for example, an (n+1)th scan line SLn+1, and are respectively coupled to the first through third data lines DLj_1, DLj_2, and DLj_3. Accordingly, if a scan signal is provided to the (n+1)th scan line SLn+1, data signals are provided via the first through third data lines DLj_1, DLj_2, and DLj_3 respectively to the first through third sub-dummy pixels SDP1, SDP2, and SDP3.

From among the first through third sub-emission pixels SEP1, SEP2, and SEP3, if the pixel circuit PC of the second sub-emission pixel SEP2 is defective, the pixel circuit PC of the second sub-emission pixel SEP2 is separated or electrically isolated from the second sub-emission device SE2, and the second sub-emission device SE2 is coupled to the repair line RLj. Also, from among the first through third sub-dummy pixels SDP1, SDP2, and SDP3, the pixel circuit PC of the second sub-dummy pixel SDP2 corresponding to the second sub-emission pixel SEP2 is coupled to the repair line RLj.

FIG. 37 shows an example that a dummy pixel is formed as a plurality of sub-pixels when a plurality of sub-pixels included in one pixel have different characteristics. However, even in this case, the same driving principal may also be applied by forming a dummy pixel as one sub-pixel and correcting a gamma value of a data signal provided to the dummy pixel.

Figure 38:
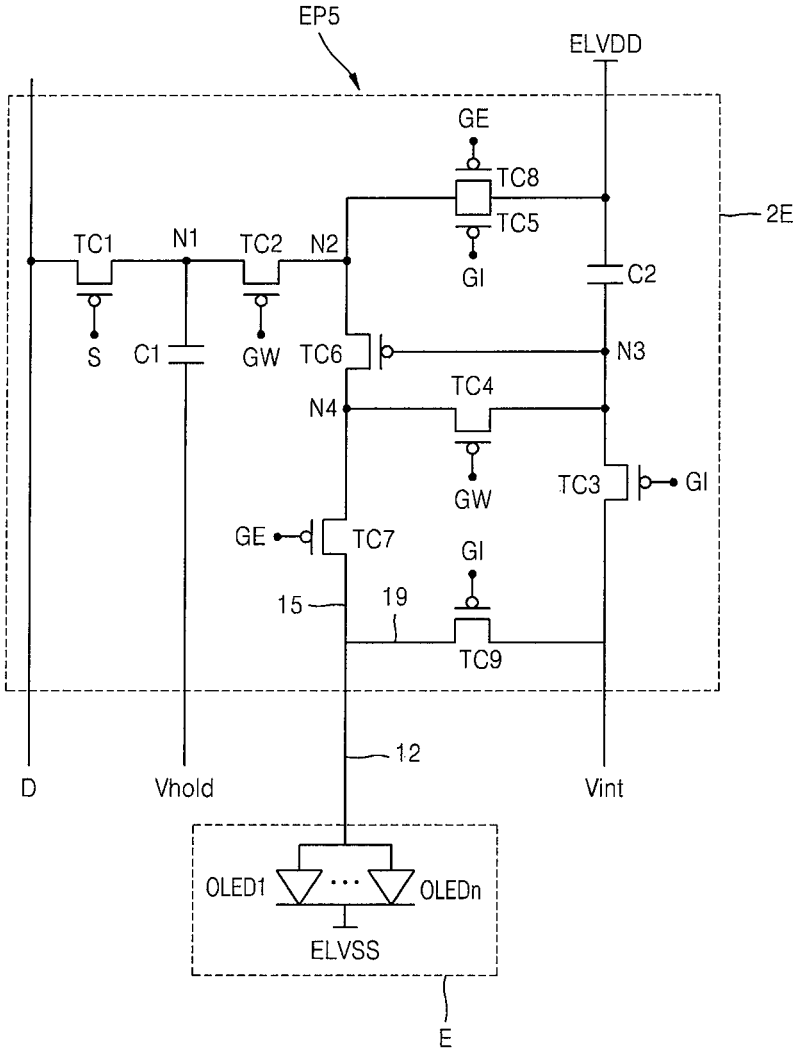
FIG. 38 is a circuit diagram of an emission pixel according to another embodiment of the present invention.

FIG. 38 is a circuit diagram of an emission pixel EP5 according to another embodiment of the present invention.

Referring to FIG. 38, the emission pixel EP5 includes the emission device E and a pixel circuit 2E for supplying a current to the emission device E. The dummy pixel DP includes the pixel circuit 2E excluding the emission device E. The emission device E includes an anode, a cathode, and an emission layer formed or located between the anode and the cathode, and may be an OLED having a structure in which the anode is split into a plurality of anodes. The emission device E may include the first through nth OLEDs OLED1 through OLEDn that are coupled in parallel to each other through the plurality of anodes resulting from the splitting of the anode. Accordingly, a driving current of the pixel circuit 2E is separately provided to the first through nth OLEDs OLED1 through OLEDn. If a defective OLED is separated or electrically isolated from the corresponding pixel circuit, because the driving current is separately provided to the other OLEDs, the OLEDs may emit light without any perceivable brightness loss. The circuit connection wiring 12 coupled to the emission device E is disconnected from the circuit wirings 15 and 19 coupled to the pixel circuit 2E by cutting the circuit wirings 15 and 19, and thus the pixel circuit 2E and the emission device E may be separated or electrically isolated from each other.

The pixel circuit 2E of FIG. 38 which further includes a ninth transistor TC9 and accordingly further includes the circuit wiring 19 coupled to the emission device E is the same as the pixel circuit 2C of FIG. 35 in terms of structure and operation, and thus a detailed description thereof will be omitted here.

A gate electrode of the ninth transistor TC9 receives the second control signal GI. A first electrode of the ninth transistor TC9 is coupled to an initialization power line and receives the initialization voltage Vint from the initialization power line. A second electrode of the ninth transistor TC9 is coupled to the anode of the emission device E. The ninth transistor TC9 is turned on by the second control signal GI and provides the initialization voltage Vint to the anode.

Figure 39:
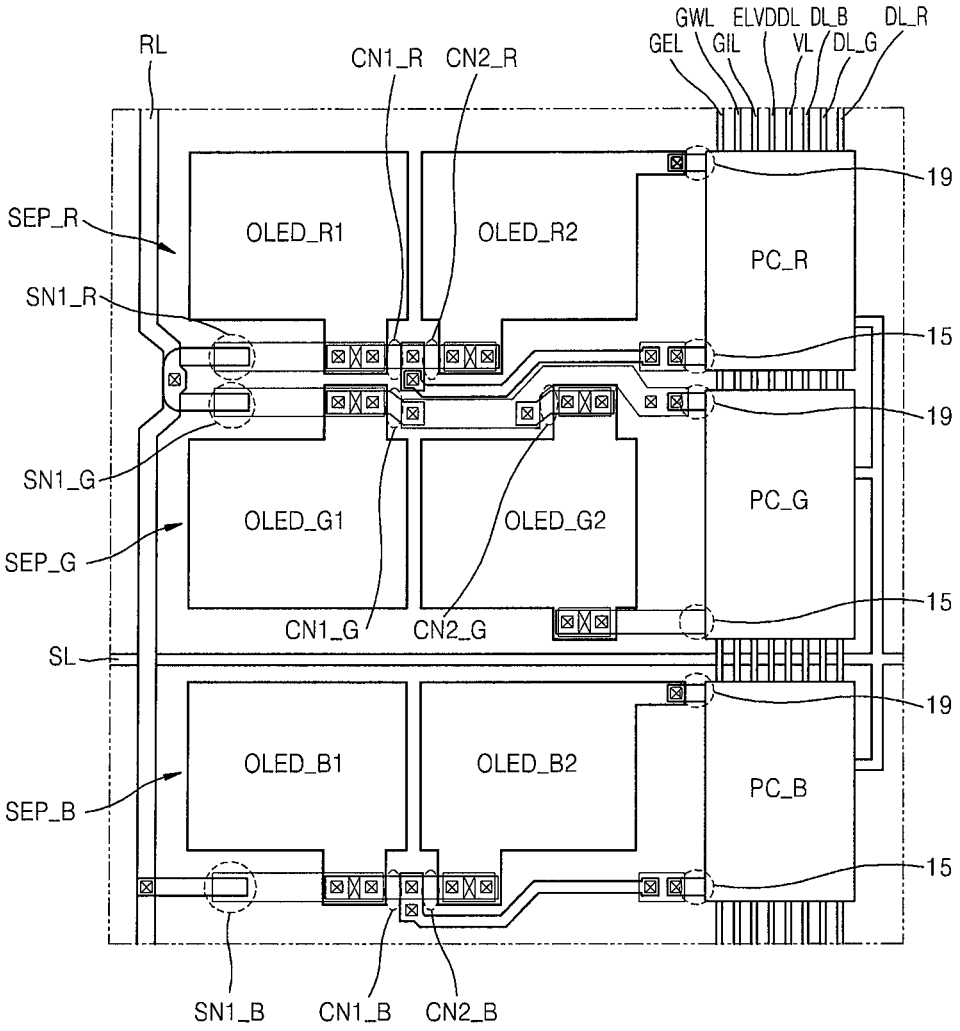
FIG. 39 is a plan view of an emission pixel including a pixel circuit of FIG. 38.

FIG. 39 is a plan view of the emission pixel EP including the pixel circuit 2E of FIG. 38.

FIG. 39 shows the emission pixel EP including three emission sub-pixels SEP_R, SEP_G, and SEP_B that are coupled to the scan line SL and a plurality of data lines DL_R, DL_G, and DL_B, respectively. The red sub-pixel SEP_R includes two red sub-emission devices OLED_R1 and OLED_R2 by an anode split and a red pixel circuit PC_R. The green sub-pixel SEP_G includes two green sub-emission devices OLED_G1 and OLED_G2 by the anode split and a green pixel circuit PC_G. The blue sub-pixel SEP_B includes two blue sub-emission devices OLED_B1 and OLED_B2 by the anode split and a blue pixel circuit PC_B. For convenience of explanation and understanding, FIG. 39 shows only an anode of each sub-emission device.

Referring to FIG. 39, the repair line RL is formed or located in a pixel column direction to the left of the three emission sub-pixels SEP_R, SEP_G, and SEP_B, and a first signal line GWL providing the first control signal GW, a second signal line GIL providing the second control signal GI, a third signal line GEL providing the third control signal GE, the power voltage line ELVDDL, an initialization voltage line VL, and the data lines DL_R, DL_G, and DL_B are formed or located in the pixel column direction to the right of the three emission sub-pixels SEP_R, SEP_G, and SEP_B.

Each of the emission sub-pixels SEP_R, SEP_G, and SEP_B includes short nodes SN1_R, SN1_G, and SN1_B that are provisionally coupled to the repair line RL, and cut nodes CN1_R, CN2_R, CN1_G, CN2_G, CN1_B, and CN2_B formed in electrode connection wirings coupling the red sub-emission devices OLED_R1 and OLED_R2, the green sub-emission devices OLED_G1 and OLED_G2, and the blue sub-emission devices OLED_B1 and OLED_B2. The red sub-emission devices OLED_R1 and OLED_R2, the green sub-emission devices OLED_G1 and OLED_G2, and the blue sub-emission devices OLED_B1 and OLED_B2 may be separated or electrically isolated from the red pixel circuit PC_R, the green pixel circuit PC_G, and the blue pixel circuit PC_B by cutting the circuit wirings 15 and 19 coupled to the red pixel circuit PC_R, the green pixel circuit PC_G, and the blue pixel circuit PC_B.

Figure 40:
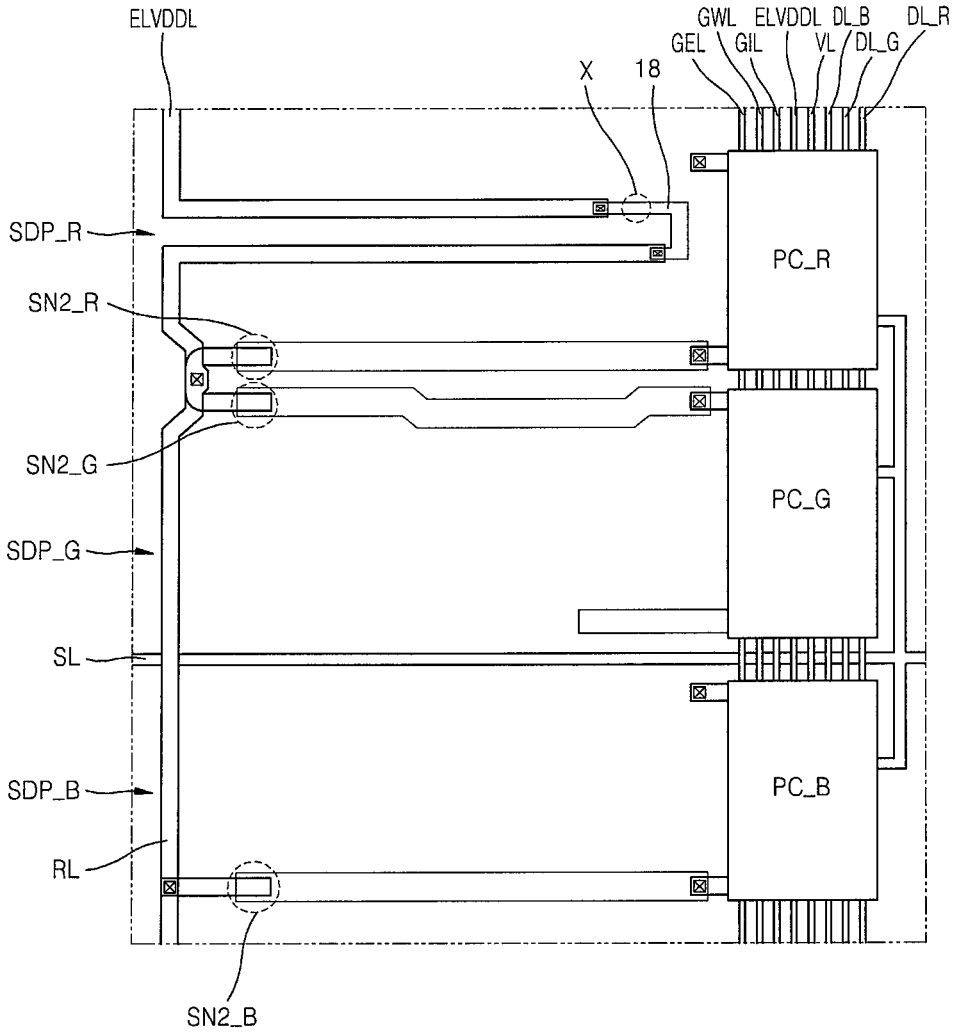
FIG. 40 is a plan view of a dummy pixel including a pixel circuit of FIG. 38.

FIG. 40 is a plan view of the dummy pixel DP including the pixel circuit 2E of FIG. 38.

FIG. 40 shows the dummy pixel DP including the three dummy sub-pixels SDP_R, SDP_G, and SDP_B that are coupled to the scan line SL and the plurality of data lines DL_R, DL_G, and DL_B, respectively. The red dummy sub-pixel SDP_R includes the red pixel circuit PC_R. The green dummy sub-pixel SDP_G includes the green pixel circuit PC_G. The blue dummy sub-pixel SDP_B includes the blue pixel circuit PC_B.

Referring to FIG. 40, the repair line RL is formed or located in a pixel column direction to the left of the three dummy sub-pixels SDP_R, SDP_G, and SDP_B. The first signal line GWL providing the first control signal GW, the second signal line GIL providing the second control signal GI, the third signal line GEL providing the third control signal GE, the power voltage line ELVDDL, the initialization voltage line VL, and the data lines DL_R, DL_G, and DL_B are formed or located in the pixel column direction to the right of the three dummy sub-pixels SDP_R, SDP_G, and SDP_B.

Each of the dummy sub-pixels SDP_R, SDP_G, and SDP_B includes short nodes SN2_R, SN2_G, and SN2_B that are provisionally coupled to the repair line RL. The repair line RL is coupled to the power voltage line ELVDDL, and when a defective pixel is repaired by using the repair line RL in the future, the power voltage line ELVDDL and the repair line RL may be separated or electrically isolated from each other by cutting a region X of the power connection wiring 18.

Figure 41:
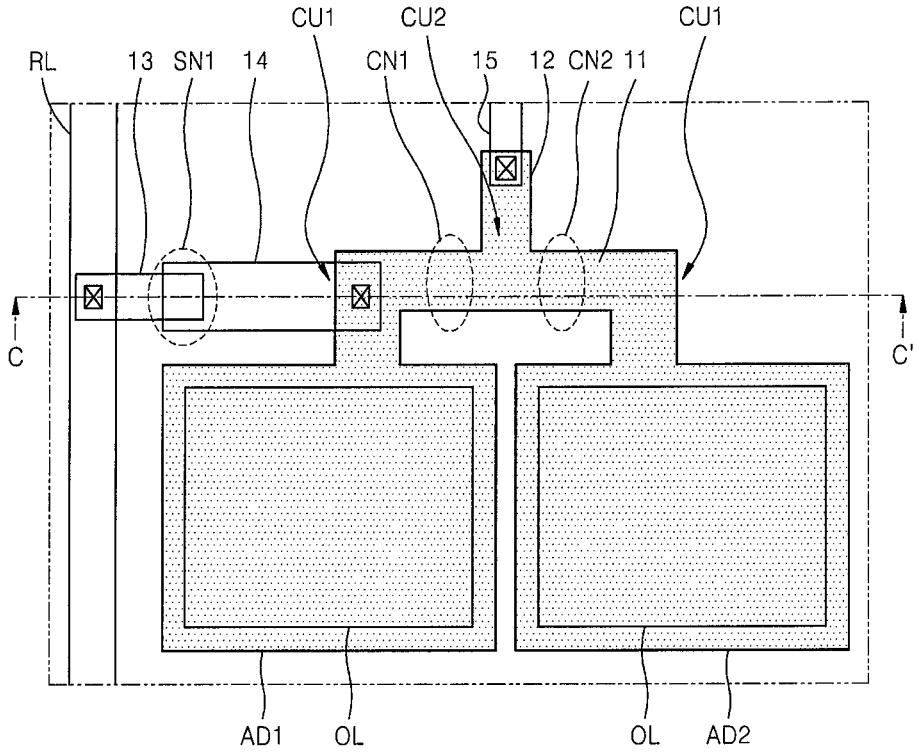
FIG. 41 is a plan view of an emission device of an emission pixel according to another embodiment of the present invention.
Figure 42:
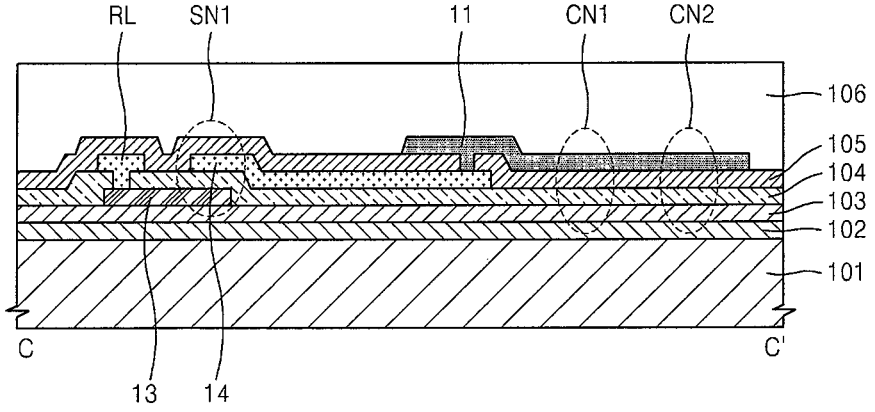
FIG. 42 is a cross-sectional view taken along a line C-C' of FIG. 41.

FIG. 41 is a plan view of the emission device E of the emission pixel EP according to another embodiment of the present invention. FIG. 42 is a cross-sectional view taken along a line C-C' of FIG. 41.

Referring to FIG. 41, split electrodes of the emission device E according to an embodiment of the present invention, i.e., the first and second anodes AD1 and AD2, the electrode connection wiring 11, and the circuit connection wiring 12, may be integrally formed. The electrode connection wiring 11 may include the first connection units CU1 coupled to the first and second anodes AD1 and AD2 and the second connection unit CU2 coupled to the circuit connection wiring 12. The first and second cut nodes CN1 and CN2 are formed between the first connection unit CU1 and the second connection unit CU2. As such, the first and second cut nodes CN1 and CN2 may be cut by irradiating a laser beam onto the first and second cut nodes CN1 and CN2 in the future. The electrode connection wiring 11 contacts the short wiring 14 that overlaps with a part of the repair connection wiring 13 in the first short node SN1 and is provisionally coupled to the repair connection wiring 13. The repair line RL is coupled to the repair connection wiring 13 through a contact hole. As such, the short wiring 14 and the repair connection wiring 13 may be coupled to each other by irradiating the laser beam onto the first short node SN1 in the future.

The repair line RL and the short wiring 14 may be formed on the same layer and of the same material as a conductive electrode included in a TFT of the pixel circuit PC, for example, a source electrode and a drain electrode. The third insulating layer 105 is formed on the repair line RL and the short wiring 14. The first and second anodes AD1 and AD2, the electrode connection wiring 11, and the circuit connection wiring 12 are integrally formed on the third insulating layer 105. The fourth insulating layer 106 covering edges of the first and second anodes AD1 and AD2 is formed on the first and second anodes AD1 and AD2.

Figure 43:
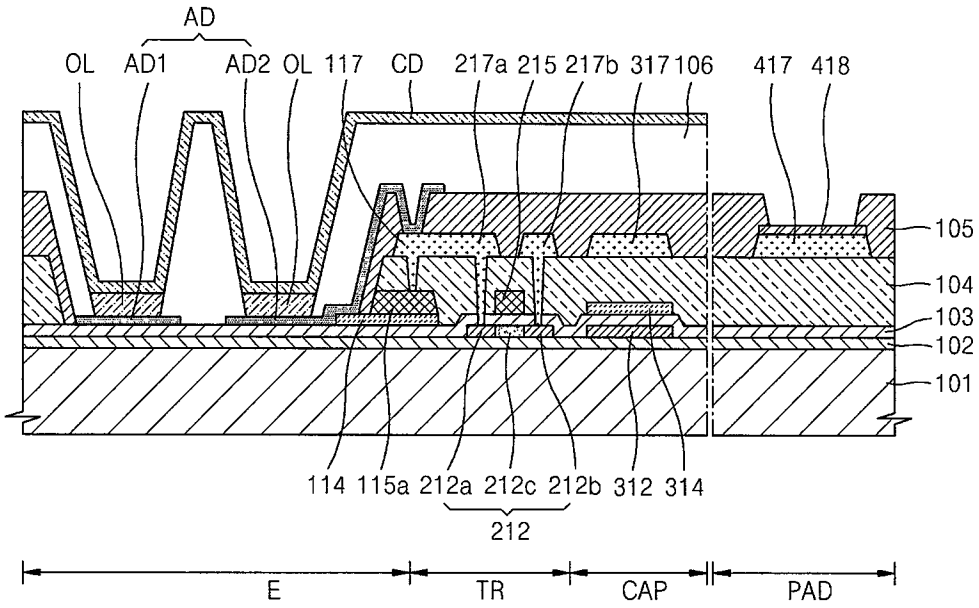
FIG. 43 is a cross-sectional diagram of an organic light emitting display apparatus including an emission pixel, according to an embodiment of the present invention.

FIG. 43 is a cross-sectional diagram of an organic light emitting display apparatus including the emission pixels EP, according to an embodiment of the present invention.

Referring to FIG. 43, the display area AA that includes the emission pixels EP and displays an image are provided on the substrate 101 of the organic light emitting display apparatus according to an embodiment of the present invention. In the non-display area NA outside the display area AA, the dummy pixel DP and a pad unit PAD that transfers a plurality of driving signals and control signals to the display area AA are formed. The emission pixels EP and the pad unit PAD are only shown in FIG. 43.

The organic light emitting display apparatus includes the emission devices E including a plurality of sub-emission devices, the pixel circuit PC including at least one TFT TR and at least one capacitor CAP and supplying a driving current to the emission device E, and the pad unit PAD.

The emission device E includes an anode AD including the split first and second anodes AD1 and AD2, a cathode CD facing the anode AD, and an organic layer OL including an emission layer formed or located between the anode AD and the cathode CD.

The anode AD may have a three layer structure including semitransparent metal and a transparent conductive oxide formed on top and bottom portions of the semitransparent metal and protecting the semitransparent metal. The semitransparent metal may include silver (Ag) or a silver alloy. The transparent conductive oxide may include at least one selected from the group consisting of ITO, IZO, ZnO, $In_2O_3$, IGO, and AZO. The semitransparent metal forms a microcavity structure along with the cathode CD, thereby increasing light efficiency of the organic light emitting display apparatus. The fourth insulating layer 106 that is a pixel definition layer covering the split first and second anodes AD1 and AD2 may be formed in edges of the split first and second anodes AD1 and AD2. One of the split first and second anodes AD1 and AD2 may be coupled to one of a source electrode 217a and a drain electrode 217b of the transistor TR through a contact metal 117.

Although not shown, the split first and second anodes AD1 and AD2 may be coupled to each other by the electrode connection wiring 11 (see FIGS. 15 and 41). The electrode connection wiring 11 may be formed on the same layer and of the same material as the anode AD or may be formed on the same layer and of the same material as an active layer 212 of the transistor TR and contact the anode AD. The electrode connection wiring 11 may contact one of the source electrode 217a and the drain electrode 217b of the transistor TR. The transistor TR coupled to the electrode connection wiring 11 may be different from the transistor TR coupled to one of the split first and second anodes AD1 and AD2.

The cathode CD may be configured as a reflective electrode including a reflective material. In this regard, the cathode CD may include at least one selected from the group consisting of Al, Mg, Li, Ca, LiF/Ca, and LiF/Al. The cathode CD may be configured as a reflective electrode so that light emitted from the organic layer OL is reflected from the cathode CD, and is transmitted through the anode AD formed of semitransparent metal, and then is emitted through the substrate 101.

The transistor TR may include the active layer 212 formed on the buffer layer 102 of the substrate 101, a gate electrode 215 formed on the active layer 212 with the first insulating layer 103 that is a gate insulating layer formed therebetween and located at a location corresponding to a channel region 212c of the active layer 212, the source electrode 217a and the drain electrode 217b disposed on the gate electrode 215 with the second insulating layer 104 that is an interlayer insulating layer formed or located therebetween and respectively coupled to a source region 212a and a drain region 212b.

The active layer 212 may be formed of a semiconductor containing amorphous or crystalline silicon, or an oxide semiconductor. The active layer 212 may include the channel region 212c and the source region 212a and the drain region 212b that are doped with ion impurities and located at opposite sides of the channel region 212c. The gate electrode 215 may be formed from a single layer or a plurality of layers including at least one metal selected from the group consisting of aluminium (Al), platinum (Pt), palladium (Pd), silver (Ag), magnesium (Mg), gold (Au), nickel (Ni), neodymium (Nd), iridium (Ir), chromium (Cr), lithium (Li), nickel (Ni), calcium (Ca), molybdenum (Mo), titanium (Ti), tungsten (W), and copper (Cu). The source electrode 217a and the drain electrode 217b may be formed from two or more layers of two different metals with different electron mobilities. For example, the two different metals may be selected from the group consisting of Al, Pt, Pd, Ag, Mg, Au, Ni, Nd, Ir, Cr, Li, Ni, Ca, Mo, Ti, W, Cu, or an alloy thereof.

The capacitor CAP may include a first electrode 312 formed on the same layer as the active layer 212, a second electrode 314 formed on the same layer as the gate electrode 215, and a third electrode 317 formed on the same layer as the source electrode 217a and the drain electrode 217b.

The first electrode 312 of the capacitor CAP may be formed of a semiconductor doped with ion impurities like the source region 212a and the drain region 212b of the active layer 212. The second electrode 314 of the capacitor CAP is formed on the first insulating layer 103 where the gate electrode 215 is formed or located, but of a different material than the gate electrode 215. The second electrode 314 may include a transparent conductive oxide. The capacitor CAP may have a metal-insulator-metal (MIM) structure by forming a semiconductor doped with ion impurities as the first electrode 312 through the second electrode 314.

First and second pad electrodes 417 and 418 that are connection terminals of an external driver may be formed in the pad unit PAD.

The first pad layer 417 may include a plurality of metal layers with different electron mobilities. For example, the first pad layer 417 may be formed from multiple layers of at least one metal selected from the group consisting of Al, Pt, Pd, Ag, Mg, Au, Ni, Nd, Ir, Cr, Li, Ni, Ca, Mo, Ti, W, and Cu.

The second pad layer 418 may be formed of a transparent conductive oxide containing at least one material selected from the group consisting of ITO, IZO, ZnO, $In_2O_3$, IGO, and AZO. The second pad layer 418 may prevent exposure of the first pad layer 417 to moisture and oxygen, thereby preventing degradation in reliability of a pad.

In the above-described embodiments, a pixel circuit is formed as a p-channel metal-oxide semiconductor (PMOS) transistor and a low-level signal is an enable signal while a high-level signal is a disable signal. However, the present invention may also be applied by forming the pixel circuit as an n-channel metal-oxide semiconductor (NMOS) transistor and inverting the provided signals. In this case, a high-level signal is an enable signal and a low-level signal is a disable signal.

In the above-described embodiments, an emission pixel circuit and a dummy pixel circuit may be the same (e.g., having a same component structure or functionality), or the dummy pixel circuit may be different (e.g., having a different component structure or functionality) from the emission pixel circuit of which TFTs and/or capacitors are partially omitted and/or added.

In the above-described embodiments, although an anode has a two split structure, the anode may have a plural split structure, for example, three split anodes, four split anodes, etc., as described above.

According to embodiments of the present invention, an operating point of a TFT is included in a saturation range and, if an anode of a defective pixel has a high resistance, a current of the defective pixel may be corrected by predicting a resistance value.

The embodiments of the present invention are not limited to the above-described pixel structure and driving method, may be applied to various pixels for emitting light by using various methods, and may achieve light emission without any perceivable brightness reduction by repairing a bright spot or a dark spot of a defective pixel due to a defect of a pixel circuit or an emission device.

A dark spot or a dark spot caused by a defective pixel circuit or emission device is relatively easily repaired by using a dummy pixel of a display apparatus of the present invention, thereby improving yield and reliability of a panel.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. An organic light-emitting display apparatus comprising:

an emission pixel comprising an emission device comprising a plurality of sub-emission devices and an emission pixel circuit connected to a first scan line and a data line, in a display area;

a dummy pixel comprising a dummy pixel circuit connected to a second scan line being different from the first scan line and the data line, in a non-display area around the display area; and a repair line extending across a column or a row in the display area to the non-display area, wherein the repair line is insulated from the emission device and the emission pixel circuit of the emission pixel and the dummy pixel circuit.

2. The organic light-emitting display apparatus of claim 1, wherein each of the plurality of sub-emission devices comprises:

a lower electrode among a plurality of separated lower electrodes;

an upper electrode commonly facing the plurality of separated lower electrodes; and an emission layer between the lower electrode and the upper electrode, wherein the plurality of separated lower electrodes are electrically coupled to each other through an electrode connection wiring.

3. The organic light-emitting display apparatus of claim 2, wherein the electrode connection wiring comprises at least one of metal, amorphous silicon, crystalline silicon, and an oxide semiconductor.

4. The organic light-emitting display apparatus of claim 2, wherein the electrode connection wiring is at a same layer and of a same material as an active layer of the emission pixel circuit.

5. The organic light-emitting display apparatus of claim 2, wherein the electrode connection wiring is integrally formed with the plurality of separated lower electrodes.

6. The organic light-emitting display apparatus of claim 2, wherein the electrode connection wiring comprises:

a plurality of first connection units coupled to the plurality of separated lower electrodes;

a second connection unit coupled to the emission pixel circuit; and a plurality of cut nodes between the first connection units and the second connection unit.

7. The organic light-emitting display apparatus of claim 6, further comprising:

at least one circuit wiring having one end coupled to the emission pixel circuit and another end coupled to the second connection unit.

8. The organic light-emitting display apparatus of claim 6, further comprising:

a first repair connection wiring having one end coupled to the repair line and another end overlapping with a first short wiring coupled to one of the first connection units; and an insulating layer between the first repair connection wiring and the first short wiring.

9. The organic light-emitting display apparatus of claim 8, wherein each of the first repair connection wiring and the first short wiring are at a same layer and of a same material as respective conductive layers formed on different layers of the emission pixel circuit.

10. The organic light-emitting display apparatus of claim 1, wherein the dummy pixel circuit is on at least one row among first and last rows of each column.

11. The organic light-emitting display apparatus of claim 1, wherein the emission pixel circuit and the dummy pixel circuit have a same component structure or function.

12. The organic light-emitting display apparatus of claim 1, further comprising:

a second repair connection wiring having one end coupled to the repair line and another end overlapping with a second short wiring coupled to the dummy pixel circuit; and an insulating layer is between the second repair connection wiring and the second short wiring.

13. The organic light-emitting display apparatus of claim 1, wherein the repair line is coupled to a power voltage line through a power connection wiring.

14. The organic light-emitting display apparatus of claim 1, wherein the emission pixel circuit comprises:

a first transistor configured to transfer a data signal in response to a scan signal;

a capacitor configured to be charged with a voltage corresponding to the data signal; and a second transistor configured to transfer a driving current corresponding to the voltage charged in the capacitor to the emission device.

15. The organic light-emitting display apparatus of claim 1, wherein the emission pixel circuit further comprises:

a first transistor configured to receive a data signal from the data line in response to a scan signal;

a second transistor configured to transfer a driving current corresponding to the data signal to the emission device;

a third transistor configured to diode-connect the second transistor;

a first capacitor configured to be charged with a voltage corresponding to the data signal; and a second capacitor connected to one electrode of the first capacitor and a gate electrode of the second transistor.

16. The organic light-emitting display apparatus of claim 15, wherein the emission pixel circuit further comprises:

a fourth transistor connected to between the first transistor and the one electrode of the first capacitor;

a fifth transistor connected to between the data line and the one electrode of the first capacitor; and a third capacitor having one electrode connected to a node between the first transistor and the fourth transistor and another electrode connected to a gate electrode of the fifth transistor.

17. The organic light-emitting display apparatus of claim 1, wherein the emission pixel circuit further comprises:

a first transistor configured to receive a data signal from the data line in response to a scan signal;

a second transistor configured to transfer a driving current corresponding to the data signal to the emission device;

a third transistor configured to diode-connect the second transistor;

a fourth transistor connected to between the first transistor and the second transistor;

a fifth transistor connected to between the second transistor and the emission device;

a sixth transistor connected to between a gate electrode of the second transistor and an initial power;

a first capacitor connected to between the gate electrode of the second transistor and a first power source; and a second capacitor having one electrode connected to a node between the first transistor and the fourth transistor and another electrode connected to a second power source.

18. The organic light-emitting display apparatus of claim 1, wherein the plurality of sub-emission devices comprises:

a first sub-emission device comprising a first lower electrode, an upper electrode facing the first lower electrode, and a first emission layer between the first lower electrode and the upper electrode; and a second sub-emission device comprising a second lower electrode, the upper electrode facing the second lower electrode, and a second emission layer between the second lower electrode and the upper electrode, wherein the first lower electrode and the second lower electrode are coupled to each other through an electrode connection wiring.

19. The organic light-emitting display apparatus of claim 18, wherein the electrode connection wiring comprises:

a first connection unit coupled to the first lower electrode;

a second connection unit coupled to the second lower electrode;

a third connection unit coupled to the emission pixel circuit;

a first node between the first connection unit and the third connection unit; and a second node between the second connection unit and the third connection unit.

20. The organic light-emitting display apparatus of claim 18, further comprising:

a first repair connection wiring having one end coupled to the repair line and another end overlapping with a first short wiring coupled to a first connection unit;

a first insulating layer between the first repair connection wiring and the first short wiring;

a second repair connection wiring having one end coupled to the repair line and another end overlapping with a second short wiring coupled to the dummy pixel circuit; and a second insulating layer between the second repair connection wiring and the second short wiring.

21. The organic light-emitting display apparatus of claim 1, wherein at least one sub-emission device of the emission pixel is separated from the emission pixel circuit of the emission pixel.

22. An organic light-emitting display apparatus comprising:

an emission pixel in a display area, the emission pixel comprising an emission device comprising a plurality of sub-emission devices and an emission pixel circuit connected to a first scan line and a data line;

a dummy pixel in a non-display area, the dummy pixel comprising a dummy pixel circuit connected to a second scan line being different from the first scan line and the data line; and a repair line extending across a column or a row in the display area to the non-display area, and coupled to a sub-emission device of the sub-emission devices of the emission pixel and the dummy pixel circuit of the dummy pixel.

23. The organic light-emitting display apparatus of claim 22, wherein the repair line is coupled to the emission device of the emission pixel and the dummy pixel circuit of the dummy pixel.

24. The organic light-emitting display apparatus of claim 23, wherein the sub-emission devices of the emission pixel are separated from the emission pixel circuit.

25. The organic light-emitting display apparatus of claim 23, wherein at least one sub-emission device of the emission pixel is electrically coupled to the repair line and is separated from the emission pixel circuit, and the rest of the sub-emission devices of the emission pixel are electrically coupled to the emission pixel circuit and are separated from the repair line.

26. The organic light-emitting display apparatus of claim 25, wherein the dummy pixel circuit of the dummy pixel is configured to supply a driving current to the at least one sub-emission device of the emission pixel, and the emission pixel circuit of the emission pixel is configured to supply a driving current to the rest of the sub-emission devices of the emission pixel.

27. The organic light-emitting display apparatus of claim 23, wherein the dummy pixel circuit of the dummy pixel is configured to supply a driving current to the emission device of the emission pixel at a predetermined time.

28. The organic light-emitting display apparatus of claim 23, wherein a data signal supplied to the dummy pixel circuit of the dummy pixel and a data signal supplied to the emission pixel circuit of the emission pixel are the same.

*29. A display apparatus comprising:*

*a first pixel circuit connected to a first scan line and a data line in a display area;*

*a first electrode electrically coupled to the first pixel circuit in the display area;*

*a second pixel circuit connected to a second scan line being different from the first scan line and the data line in a non-display area around the display area;*

*a conductive pattern in a layer different from the first electrode, the conductive pattern comprising a repair line extending across a column or a row from the display area to the non-display area, the repair line being insulated from the first pixel circuit and the second pixel circuit; and*

*a first connection member electrically coupled to the first electrode and the first pixel circuit, the first connection member overlapping a portion of the conductive pattern in a plan view and insulated from the overlapped portion of the conductive pattern.*

*30. The display apparatus of claim 29, wherein the first connection member is between the first electrode and the conductive pattern in a cross-sectional view.*

*31. The display apparatus of claim 29, further comprising a second connection member electrically coupled to the second pixel circuit and overlapping a portion of the conductive pattern.*

*32. The display apparatus of claim 29, further comprising:*

*an emission layer on the first electrode; and*

*a second electrode on the emission layer and facing the first electrode.*

*33. The display apparatus of claim 29, wherein the first connection member is on a same layer as a source electrode and a drain electrode of a thin film transistor included in the first pixel circuit.*

*34. The display apparatus of claim 29, wherein the first connection member comprises a first layer comprising titanium and a second layer comprising aluminum.*

*35. The display apparatus of claim 29, wherein a portion of the conductive pattern that overlaps the first connection member comprises molybdenum.*

*36. The display apparatus of claim 29, wherein the conductive pattern further comprises a connection wiring electrically coupled to the repair line, and*

*wherein a portion of the conductive pattern that overlaps the first connection member comprises a portion of the connection wiring.*

*37. The display apparatus of claim 29, wherein the conductive pattern further comprises a connection wiring electrically coupled to the repair line, and*

*wherein a portion of the repair line overlaps a portion of the connection wiring.*

*38. The display apparatus of claim 29, wherein a portion of the first connection member that overlaps the conductive pattern is spaced apart from a portion of the first connection member that contacts the first electrode via an opening.*

*39. The display apparatus of claim 29, wherein the conductive pattern is electrically coupled to a power voltage line electrically coupled to the first pixel circuit.*

*40. The display apparatus of claim 29, wherein the first scan line extends in a first direction, and*

*wherein the data line extends in a second direction different from the first direction.*

*41. The display apparatus of claim 40, wherein the conductive pattern is parallel with the first scan line.*

*42. The display apparatus of claim 40, wherein the conductive pattern is parallel with the first data line.*

*43. The display apparatus of claim 29, further comprising:*

*a first connection wiring electrically coupled to the first pixel circuit; and*

*a second connection wiring electrically coupled to the first connection member and the first connection wiring.*

*44. A display apparatus comprising:*

*a first pixel circuit connected to a first scan line and a data line in a display area;*

*a second pixel circuit connected to a second scan line being different from the first scan line and the data line in a non-display area around the display area;*

*a first electrode in the display area;*

*a conductive pattern in a layer different from the first electrode, the conductive pattern comprising a repair line extending across a column or a row from the display area to the non-display area; and*

*a first connection member between the first electrode and the conductive pattern in a cross-sectional view, and electrically coupled to the first electrode and the conductive pattern.*

*45. The display apparatus of claim 44, wherein the first pixel circuit is disconnected from the first electrode.*

*46. The display apparatus of claim 45, wherein the first connection member is on a same layer as a source electrode and a drain electrode of a thin film transistor included in the first pixel circuit.*

*47. The display apparatus of claim 44, further comprising a second connection member electrically coupled to the second pixel circuit and the conductive pattern.*

*48. The display apparatus of claim 44, further comprising:*

*an emission layer on the first electrode; and*

*a second electrode on the emission layer and facing the first electrode.*

*49. The display apparatus of claim 44, wherein the first connection member comprises a first layer comprising titanium and a second layer comprising aluminum.*

*50. The display apparatus of claim 44, wherein a portion of the conductive pattern that overlaps and is electrically coupled to the first connection member comprises molybdenum.*

*51. The display apparatus of claim 44, wherein the conductive pattern further comprises a connection wiring electrically coupled to the repair line, and*

*wherein a portion of the conductive pattern that overlaps and is electrically coupled to the first connection member comprises a portion of the connection wiring.*

*52. The display apparatus of claim 44, wherein the first scan line extends in a first direction, and*

*wherein the data line extends in a second direction different from the first direction.*

*53. The display apparatus of claim 52, wherein the conductive pattern is parallel with the first scan line.*

*54. The display apparatus of claim 52, wherein the conductive pattern is parallel with the first data line.*

* * * * *